(12) United States Patent
Xie et al.

(10) Patent No.: US 11,215,670 B2
(45) Date of Patent: Jan. 4, 2022

(54) METHOD FOR UPDATING VOLTAGE DIFFERENCE OF BATTERY, METHOD FOR ESTIMATING STATE OF CHARGE, ELECTRONIC DEVICE, AND STORAGE UNIT

(71) Applicant: Dongguan NVT Technology Limited, Dongguan (CN)

(72) Inventors: Hong Xie, Dongguan (CN); Ya-Qing Sun, Dongguan (CN); chaoqiang Hu, Dongguan (CN); Shaorong Lu, Dongguan (CN)

(73) Assignee: DONGGUAN TECHNOLOGY LIMITED, Dongguan (CN)

( * ) Notice: Subject to any disclaimer, the term of this patent is extended or adjusted under 35 U.S.C. 154(b) by 0 days.

(21) Appl. No.: 16/931,675

(22) Filed: Jul. 17, 2020

(65) Prior Publication Data
US 2021/0208202 A1 Jul. 8, 2021

(30) Foreign Application Priority Data
Jan. 6, 2020 (CN) .......................... 202010011610.7

(51) Int. Cl.
*G01R 31/3842* (2019.01)
*G01R 31/36* (2020.01)
*G01R 31/367* (2019.01)
*G01R 31/374* (2019.01)

(52) U.S. Cl.
CPC ....... *G01R 31/3842* (2019.01); *G01R 31/367* (2019.01); *G01R 31/3648* (2013.01); *G01R 31/374* (2019.01)

(58) Field of Classification Search
None
See application file for complete search history.

(56) References Cited

U.S. PATENT DOCUMENTS

2012/0293131 A1* 11/2012 Nakamura ............ H01M 10/42
320/134

* cited by examiner

*Primary Examiner* — Jas A Sanghera
(74) *Attorney, Agent, or Firm* — Ladas & Parry LLP

(57) ABSTRACT

A method for updating voltage difference of battery includes presetting a relationship of voltage difference of the battery vs. state of charge of the battery, detecting a state of charge-1 of the battery, and determining a first voltage difference of the battery according to the state of charge-1 of the battery. The method further includes updating the relationship of voltage difference of the battery vs. state of charge according to the first voltage difference of the battery. A method for estimating state of charge, an electronic device, and a non-transitory storage medium are further provided.

35 Claims, 9 Drawing Sheets

METHOD FOR UPDATING VOLTAGE DIFFERENCE OF BATTERY, METHOD FOR ESTIMATING STATE OF CHARGE, ELECTRONIC DEVICE, AND STORAGE UNIT

CROSS-REFERENCE TO RELATED APPLICATIONS

This application claims priority to Chinese Patent Application No. 202010011610.7 filed on Jan. 6, 2020 in the China Intellectual Property Office, the contents of which are incorporated by reference herein.

FIELD

The disclosure relates to batteries, and more particularly, to a method for updating voltage difference of battery, a method for estimating state of charge of the battery, an electronic device, and a storage unit.

BACKGROUND

Lithium ion batteries have advantages like high energy density, high power, high numbers of charging and discharging cycles, long storage time etc. The lithium ion batteries have wide application in electronic equipment, such as electric vehicles, energy storage facilities, and so on. Lithium ion batteries play an important role in global problems such as energy storage, and in environmental concerns.

Voltage difference of the lithium ion battery vs. state of charge curves (hereinafter VD vs. SOC curves) are of interest in usage of the batteries. However, the VD vs. SOC curves are measured in a laboratory environment. In everyday operation, actual voltage difference of the lithium ion battery vs. state of charge curves may be different from the VD vs. SOC curves in the laboratory because of various factors in the environment of use, thus a determination of the actual state of the battery in everyday usage may not follow the laboratory standard.

SUMMARY

An embodiment of the present application provides a method for updating voltage difference of battery, a method for estimating state of charge, an electronic device, and a storage unit for updating a first relation model table.

An embodiment of the present application provides a method for updating voltage difference of battery. The method for updating voltage difference of battery includes presetting a relationship of voltage difference vs. state of charge (hereinafter VD vs. SOC relationship), and detecting a state of charge-1 of the battery (hereinafter SOC-1); determining a first voltage difference of the battery according to the SOC-1; and updating the VD vs. SOC relationship according to the first voltage difference of the battery.

According to some embodiments of the present application, determining a first voltage difference of the battery according to the SOC-1 includes: determining the first voltage difference of the battery when the battery is discharged at a plurality of different rates according to the SOC-1.

According to some embodiments of the present application, determining a first voltage difference of the battery according to the SOC-1 includes determining the first voltage difference of the battery during the battery discharging period according to the SOC-1.

According to some embodiments of the present application, the method for updating voltage difference of battery further includes detecting a state of charge-2 of the battery (hereinafter SOC-2) and an actual capacity-1 of the battery; determining a first state of charge (hereinafter first SOC) according to the SOC-2 and the actual capacity-1 of the battery; and determining the SOC-1 according to the first SOC.

According to some embodiments of the present application, the method for updating voltage difference of battery further includes determining a second state of charge (hereinafter second SOC) according to the SOC-2; and determining a state of charge-3 of the battery (hereinafter SOC-3) according to the first SOC and the second SOC.

According to some embodiments of the present application, the SOC-2 is an initialized state of charge (hereinafter initialized SOC) and the actual capacity-1 of the battery is a preset capacity when the first SOC is determined for the first time.

According to some embodiments of the present application, the method for updating voltage difference of battery further includes: determining a first open circuit voltage (hereinafter first OCV); and determining the initialized SOC according to the first OCV.

According to some embodiments of the present application, determining the first OCV includes: determining that the first OCV is a current battery voltage.

According to some embodiments of the present application, determining the initialized SOC according to the first OCV includes: querying the VD vs. SOC relationship to determine the initialized SOC according to the first OCV.

According to some embodiments of the present application, determining a first SOC according to the SOC-2 and the actual capacity-1 of the battery includes: determining a first SOC according to the SOC-2 and the actual capacity-1 of the battery via a coulomb counting method.

According to some embodiments of the present application, determining a first SOC according to the SOC-2 and the actual capacity-1 of the battery via a coulomb counting method includes: determining the first SOC according to the SOC-2, a current battery current, a difference between current time and a previous time (a sampling interval) of obtaining the battery current, and the actual capacity-1 of the battery via the coulomb counting method.

According to some embodiments of the present application, the coulomb counting method includes: $SOC_1 = SOC_0 + I_{bat} \times \Delta t / Q_{abs}$; wherein $SOC_1$ is the first SOC, $SOC_0$ is a SOC-2, $I_{bat}$ is a current battery current, $\Delta t$ is a sampling interval of obtaining the battery current, and $Q_{abs}$ is an actual capacity-1 of the battery.

According to some embodiments of the present application, determining the first voltage difference of the battery during the battery discharging period according to the SOC-1 includes: determining a second open circuit voltage (hereinafter second OCV) according to the SOC-1; and determining the first voltage difference of the battery during the battery discharging period according to the second OCV.

According to some embodiments of the present application, determining a second OCV according to the SOC-1 includes: querying the VD vs. SOC relationship to determine the second OCV according to the SOC-1.

According to some embodiments of the present application, determining the first voltage difference of the battery during the battery discharging period according to the second OCV includes: determining that the first voltage difference of the battery during the battery discharging period is a value of difference between the second OCV and the current battery voltage.

According to some embodiments of the present application, updating the VD vs. SOC relationship according to the first voltage difference of the battery includes: processing the first voltage difference of the battery via a monadic linear regression method to determine a second voltage difference of the battery; and updating the VD vs. SOC relationship according to the second voltage difference of the battery.

According to some embodiments of the present application, before updating the VD vs. SOC relationship according to the second voltage difference of the battery, the method for updating voltage difference of battery includes: determining that an absolute value of a difference between the second voltage difference of the battery and the third voltage difference of the battery is less than an allowable maximum voltage difference.

According to some embodiments of the present application, presetting a VD vs. SOC relationship includes: presetting the VD vs. SOC relationship at each of a plurality of different temperatures; the method for updating voltage difference of battery further includes: detecting a current battery temperature; updating the VD vs. SOC relationship according to the first voltage difference of the battery includes: updating the VD vs. SOC relationship at each of the plurality of different temperatures according to the first voltage difference of the battery and the battery temperature.

An embodiment of the present application provides a method for estimating state of charge, the method for estimating state of charge includes: presetting a VD vs. SOC relationship; detecting a SOC-1; determining a first voltage difference of the battery according to the SOC-1; updating the VD vs. SOC relationship according to the first voltage difference of the battery; determining a variation of the state of charge (hereinafter SOC) of the battery when the battery gets fully discharged via simulation and according to the updated VD vs. SOC relationship; and estimating a residual capacity of the battery according to the variation of the SOC of the battery.

According to some embodiments of the present application, determining a first voltage difference of the battery according to the SOC-1 includes: determining the first voltage difference of the battery when the battery is discharged at a plurality of different rates according to the SOC-1.

According to some embodiments of the present application, determining a first voltage difference of the battery according to the SOC-1 includes: determining the first voltage difference of the battery during the battery discharging period according to the SOC-1.

According to some embodiments of the present application, the method for estimating state of charge further includes: detecting a SOC-2 and an actual capacity-1 of the battery; determining a first SOC according to the SOC-2 and the actual capacity-1 of the battery; and determining the SOC-1 according to the first SOC.

According to some embodiments of the present application, the method for estimating state of charge further includes: determining a second SOC according to the SOC-2; and determining a SOC-3 according to the first SOC and the second SOC.

According to some embodiments of the present application, the SOC-2 is an initialized SOC and the actual capacity-1 of the battery is a preset capacity when the first SOC is determined for the first time.

According to some embodiments of the present application, the method for estimating state of charge further includes: determining a first OCV; and determining the initialized SOC according to the first OCV.

According to some embodiments of the present application, determining a first OCV includes: determining that the first OCV is a current battery voltage.

According to some embodiments of the present application, determining the initialized SOC according to the first OCV includes: querying the VD vs. SOC relationship to determine the initialized SOC according to the first OCV.

According to some embodiments of the present application, determining a first SOC according to the SOC-2 and the actual capacity-1 of the battery includes: determining a first SOC according to the SOC-2 and the actual capacity-1 of the battery via a coulomb counting method.

According to some embodiments of the present application, determining a first SOC according to the SOC-2 and the actual capacity-1 of the battery and via a coulomb counting method includes: determining the first SOC according to the SOC-2, a current battery current, a sampling interval of obtaining the battery current, and the actual capacity-1 of the battery via the coulomb counting method.

According to some embodiments of the present application, the coulomb counting method includes: $SOC_1 = SOC_0 + I_{bat} \times \Delta t / Q_{abs}$; wherein $SOC_1$ is the first SOC, $SOC_0$ is a SOC-2, $I_{bat}$ is a current battery current, $\Delta t$ is a sampling interval of obtaining the battery current, and $Q_{abs}$ is an actual capacity-1 of the battery.

According to some embodiments of the present application, determining the first voltage difference of the battery during the battery discharging period according to the SOC-1 includes: determining a second OCV according to the SOC-1; and determining the first voltage difference of the battery during the battery discharging period according to the second OCV.

According to some embodiments of the present application, determining a second OCV according to the SOC-1 includes: querying the VD vs. SOC relationship to determine the second OCV according to the SOC-1.

According to some embodiments of the present application, determining the first voltage difference of the battery during the battery discharging period according to the second OCV includes: determining that the first voltage difference of the battery during the battery discharging period is a value of difference between the second OCV and the current battery voltage.

According to some embodiments of the present application, updating the VD vs. SOC relationship according to the first voltage difference of the battery includes: processing the first voltage difference of the battery via a monadic linear regression method to determine a second voltage difference of the battery; and updating the VD vs. SOC relationship according to the second voltage difference of the battery.

According to some embodiments of the present application, before updating the VD vs. SOC relationship according to the second voltage difference of the battery, the method for estimating state of charge includes: determining that an absolute value of a difference between the second voltage difference of the battery and the third voltage difference of the battery is less than an allowable maximum voltage difference.

According to some embodiments of the present application, presetting a VD vs. SOC relationship includes: presetting the VD vs. SOC relationship at a plurality of different temperatures; the method for estimating state of charge further includes: detecting a current battery temperature;

updating the VD vs. SOC relationship according to the first voltage difference of the battery includes: updating the VD vs. SOC relationship at each of the plurality of different temperatures according to the first voltage difference of the battery and the battery temperature.

According to some embodiments of the present application, determining a variation of the SOC of the battery when the battery gets fully discharged via simulation and according to the updated VD vs. SOC relationship includes: updating a ratio coefficient table at a preset discharge rate between the first voltage difference of the battery corresponding to each of the plurality of different SOCs of the battery at each of the plurality of different temperatures and the first voltage difference of the battery corresponding to each of the plurality of different SOCs of the battery at preset temperature according to the updated VD vs. SOC relationship; determining the variation of the SOC of the battery when the battery gets fully discharged via simulation and according to the updated ratio coefficient table.

According to some embodiments of the present application, determining the variation value of the SOC of the battery when the battery gets fully discharged via simulation and according to the updated ratio coefficient table includes: determining a current SOC of the battery; estimating a current voltage of the battery according to the current SOC of the battery, a current temperature of the battery, and an updated ratio coefficient table; determining whether the current voltage of the battery is less than or equal to a voltage when the battery gets fully discharged; if the current voltage of the battery is greater than the voltage when the battery gets fully discharged, continuing to determine the current SOC of the battery, and estimate the current voltage of the battery according to the current SOC of the battery, the current temperature of the battery, and the updated ratio coefficient table until the current voltage of the battery is less than or equal to the voltage when the battery gets fully discharged; and if the current voltage of the battery is less than or equal to the voltage when the battery gets fully discharged, determining the variation value of the SOC of the battery when the battery gets fully discharged.

According to some embodiments of the present application, determining a current SOC of the battery includes: detecting a previous SOC of the battery; and estimating a current SOC of the battery according to the previous SOC of the battery.

According to some embodiments of the present application, when the current voltage of the battery is estimated for a first time: detecting the previous SOC of the battery includes: detecting the SOC of the battery at a beginning of the simulation; and estimating the current SOC of the battery according to the previous SOC of the battery includes: estimating the current SOC of the battery according to the SOC of the battery at the beginning of the simulation.

According to some embodiments of the present application, estimating the current voltage of the battery according to the current SOC of the battery, the current temperature of the battery, and an updated ratio coefficient table includes: estimating a current open circuit voltage (hereinafter OCV) according to the current SOC of the battery; estimating a current voltage difference of the battery according to the current SOC of the battery, the current temperature of the battery, and the updated ratio coefficient table; estimating the current voltage of the battery according to the current OCV and the current voltage difference of the battery.

According to some embodiments of the present application, estimating the current voltage difference of the battery according to the current SOC of the battery, the current temperature of the battery, and the updated ratio coefficient table includes: estimating a voltage difference coefficient at a discharge current of the battery according to the updated ratio coefficient table; and estimating the current voltage difference of the battery according to the current SOC of the battery, the current temperature of the battery, and the voltage difference coefficient.

According to some embodiments of the present application, estimating the voltage difference coefficient at the discharge current of the battery according to the updated ratio coefficient table includes: estimating the voltage difference coefficient at the discharge current of the battery according to an equation $$k = K(SOC, T) \times \frac{I}{MC},$$

wherein k is the voltage difference coefficient at the discharge current of the battery, K(SOC, T) is the updated ratio coefficient table, I is the discharge current of the battery, and MC is a preset discharge rate.

According to some embodiments of the present application, estimating a current voltage difference of the battery according to the current SOC of the battery, the current temperature of the battery, and the voltage difference coefficient includes: estimating a current voltage difference of the battery according to an equation $\Delta V(SOC,T,I)=\Delta V(SOC,N° C.)\times k$, wherein $\Delta V(SOC,T,I)$ is the current voltage difference of the battery, $\Delta V(SOC,N° C.)$ is a VD vs. SOC relationship at a preset temperature and at a preset discharge rate, N° C. is a preset temperature, and k is a voltage difference coefficient at a discharge current of the battery.

According to some embodiments of the present application, before estimating the current voltage difference of the battery according to the current SOC of the battery, the current temperature of the battery, and the updated ratio coefficient table, the method for estimating state of charge further includes: estimating the current temperature of the battery.

According to some embodiments of the present application, estimating the current temperature of the battery includes: detecting a previous temperature of the battery; estimating a current variation value of the temperature of the battery; and estimating the current temperature of the battery according to the previous temperature of the battery and the current variation value of the temperature of the battery.

According to some embodiments of the present application, estimating the current variation value of the temperature of the battery includes: estimating the current variation value of the temperature of the battery according to an equation $$c \times m \times \frac{dT}{dt} = I^2 \times R + I \times T \times \frac{\partial E}{\partial T} - h \times S \times (T - Tenv),$$

wherein c is a specific heat capacity of the battery, m is a quality of the battery, $$\frac{dT}{dt}$$

is a variation value of the temperature of the battery, I is a discharge current of the battery, R is a current impedance of the battery, T is a previous temperature of the battery, $$\frac{\partial E}{\partial T}$$

is an entropy coefficient of the battery, h is a heat transfer coefficient of the battery, S is a surface area of the battery, and Tenv is an environment temperature.

According to some embodiments of the present application, before estimating the current variation value of the temperature of the battery according to the equation $$c \times m \times \frac{dT}{dt} = I^2 \times R + I \times T \times \frac{\partial E}{\partial T} - h \times S \times (T - Tenv),$$

the method for estimating state of charge further includes: querying an updated VD vs. SOC relationship to estimate a terminal voltage of the battery according to the current SOC of the battery; and estimating the current impedance of the battery according to an equation $$R = \frac{V}{I},$$

wherein R is the current impedance of the battery, V is the terminal voltage of the battery, and I is a discharge current of the battery.

According to some embodiments of the present application, estimating a residual capacity of the battery according to the variation value of the SOC of the battery includes: estimating the residual capacity of the battery according to an equation $Q_{res} = \Delta SOC \times Q_{abs}$, wherein $Q_{res}$ is the residual capacity of the battery, $\Delta SOC$ is the variation value of the SOC of the battery, and $Q_{abs}$ is an actual capacity-2 of the battery.

According to some embodiments of the present application, after estimating the residual capacity of the battery according to the variation value of the SOC of the battery, the method for estimating state of charge includes: estimating a full charge capacity of the battery; and estimating the residual SOC of the battery according to the residual capacity of the battery and the full charge capacity of the battery.

According to some embodiments of the present application, estimating the full charge capacity of the battery includes: estimating the full charge capacity of the battery via an equation $FCC = Q_{star} + Q_{past} + Q_{res}$, wherein FCC is the full charge capacity of the battery, $Q_{star}$ is a discharge capacity at the SOC after the full charge of the battery and before the first charge and discharge cycle, $Q_{past}$ is a discharge capacity after the SOC and before the beginning of the simulation, and $Q_{res}$ is the residual capacity of the battery.

According to some embodiments of the present application, estimating the residual SOC of the battery according to the residual capacity of the battery and the full charge capacity of the battery includes: estimating the residual SOC of the battery according to an equation $$RSOC = \frac{Q_{res}}{FCC},$$

wherein RSOC is the residual SOC of the battery, $Q_{res}$ is the residual capacity of the battery, and FCC is the full charge capacity of the battery.

An embodiment of the present application also provides an electronic device, the electronic device includes a battery, at least one processor, and a storage system storing one or more programs that when executed by the at least one processor, causes the at least one processor to preset a VD vs. SOC relationship, detect a SOC-1, determine a first voltage difference of the battery according to the SOC-1, and update the VD vs. SOC relationship according to the first voltage difference of the battery.

An embodiment of the present application also provides a non-transitory storage unit, the non-transitory storage unit having stored thereon instructions that when executed by a processor of a terminal device, cause the processor to perform a method for updating voltage difference of battery, the electronic device comprising a battery, the method comprising the presetting of a VD vs. SOC relationship, detecting a SOC-1, determining a first voltage difference of the battery according to the SOC-1, and updating the VD vs. SOC relationship according to the first voltage difference of the battery.

The method for updating voltage difference of battery, the method for estimating state of charge, the electronic device, and the storage unit provided by the present disclosure require the presetting of a VD vs. SOC relationship, the detecting of a SOC-1, the determining of a first voltage difference of the battery according to the SOC-1, and the updating of the VD vs. SOC relationship according to the first voltage difference of the battery. Thus, the method for updating voltage difference of battery, the method for estimating state of charge, the electronic device, and the storage unit provided by the present disclosure work together to update the VD vs. SOC relationship.

BRIEF DESCRIPTION OF THE DRAWINGS

Implementations of the present disclosure will now be described, by the way of embodiments, with reference to the attached figures.

The numerical symbols for main elements are; 100 represents an electronic device, 11 represents a storage unit, 12 represents at least one processor, 13 represents a battery, 14 represents an analog to digital converter, and 15 represents a sensor.

Implementations of the disclosure are described with reference to the drawings.

DETAILED DESCRIPTION

Implementations of the disclosure are described, by the way of embodiments only, with reference to the drawings.

The disclosure is illustratively only, and changes may be made in the detail within the principles of the present disclosure.

Unless otherwise defined, all technical terms used herein have the same meaning as commonly understood by one of ordinary skill in the art. The technical terms used herein are not to be considered as limiting the scope of the embodiments.

Implementations of the disclosure will now be described, by the way of embodiments only, with reference to the drawings. It should be noted that non-conflicting details and features in the embodiments of the present disclosure may be combined with each other.

Figure 1:
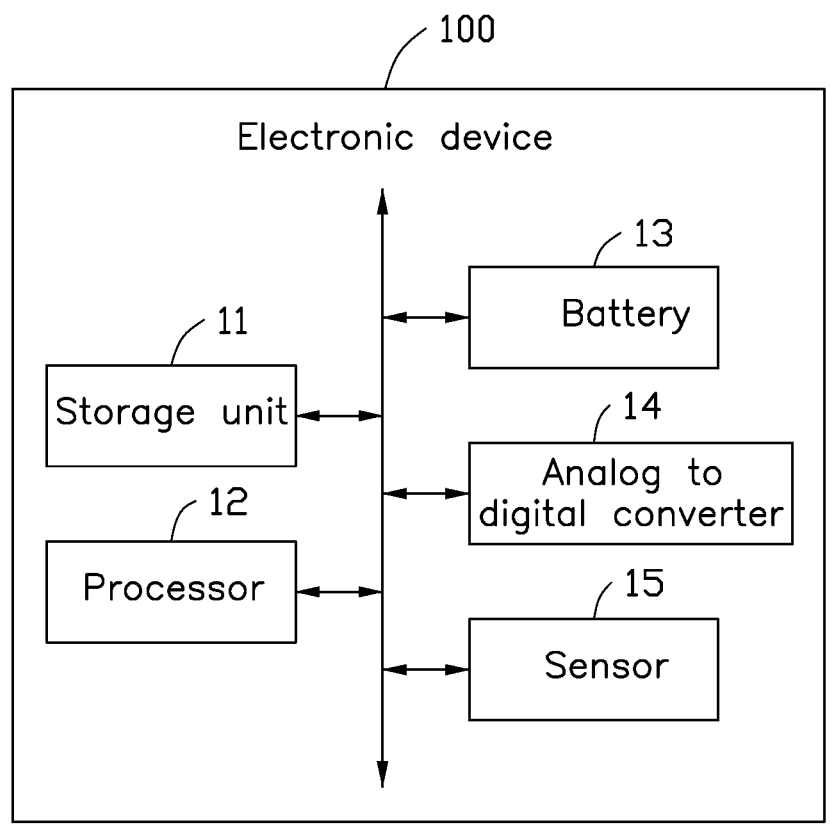
FIG. 1 is a block diagram of an electronic device.

Referring to FIG. 1, an electronic device 100 can include, but is not limited to, a storage unit 11, at least one processor 12, a battery 13, an analog to digital converter 14, and a sensor 15. The foregoing components of the electronic device 100 can be interconnected via a bus, or interconnected directly.

FIG. 1 illustrates only one example of the electronic device 100, other examples can comprise more or fewer components that those shown in the embodiment, or have a different configuration of the various components. The electronic device 100 can be, but is not limited to, an electric motorcycle, an electric bicycle, an electric car, a mobile phone, a tablet computer, a personal digital assistant (PDA), a personal computer, or any other suitable rechargeable electronic device.

In at least one embodiment, the battery 13 is a rechargeable battery, supplying power to the electronic device 100. For example, the battery 13 may be a lead-acid battery, a nickel-cadmium battery, a nickel metal hydride battery, a lithium ion battery, a lithium polymer battery, a lithium iron phosphate battery, or the like. The battery 13 is logically coupled to the at least one processor 12 via a battery management system (hereinafter BMS), to implement charge function, discharge function, or the like, via the BMS. The BMS can be communicationally coupled to a power conversion system (hereinafter PCS) via CAN bus or RS485. The battery 13 includes a battery cell.

In the embodiment, the analog to digital converter 14 is configured to collect a voltage of the battery cell and a current of the battery cell during a charging state, a discharging state, or an idle state. In the embodiment, the analog to digital converter 14 includes a digital filter. The digital filter is configured to filter the voltage of the battery cell and the current of the battery cell during the charging state, the discharging state, and the idle state. In at least one embodiment, the digital filter can be a first order low pass filter. The sensor 15 is configured to collect the temperature of the battery cell of the battery during the above states. In at least one embodiment, the sensor 15 can be a negative temperature coefficient thermistor. It can be understood that, the electronic device 100 can further include other components, for example a pressure sensor, a light sensor, a gyroscope, a hygrometer, an infrared sensor, and so on.

Figure 2:
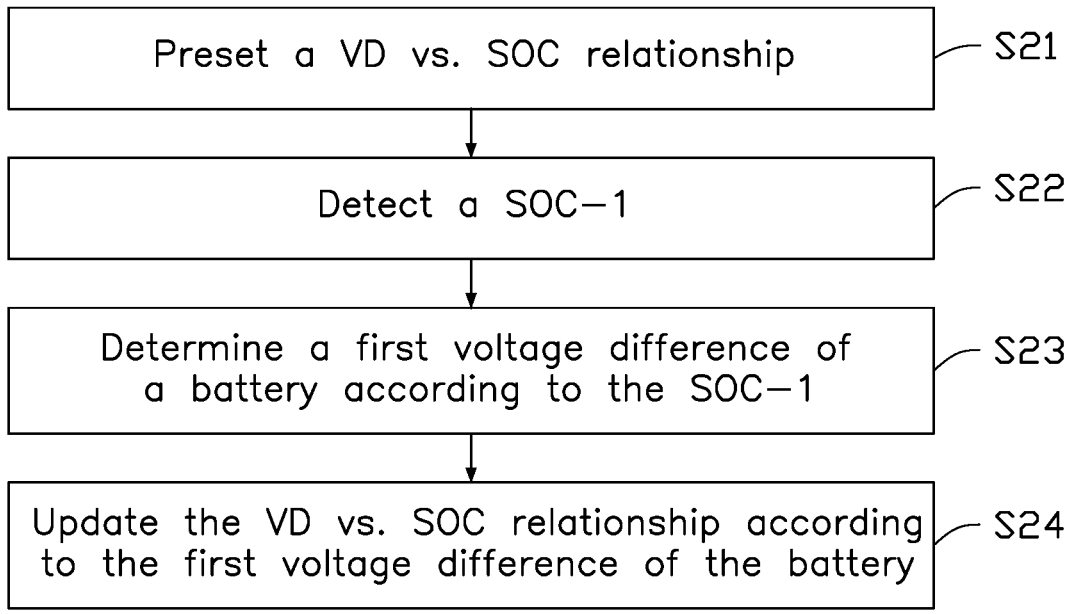
FIG. 2 is a flowchart of a method for updating voltage difference of battery.

FIG. 2 shows a method for updating voltage difference of battery. A SOC-1 of the present disclosure is an SOC of the battery during a battery discharging period, a SOC-2 is a previous SOC of the battery, and a SOC-3 is a current SOC of the battery. An actual capacity-1 of the battery is a previous actual capacity of the battery, and an actual capacity-2 of the battery is a current actual capacity of the battery. The first SOC is the SOC calculated during a charge-discharging state via a coulomb counting method, and a second SOC is the SOC calculated during the idle state via Ohm's law.

The present disclosure presets a VD vs. SOC relationship, detects the SOC-2 and the actual capacity-1 of the battery, determines the second SOC according to the SOC-2, determines the first SOC according to the SOC-2 and the actual capacity-1 of the battery, determines the SOC-1 according to the first SOC, and determines a first voltage difference of the battery according to the SOC-1. The VD vs. SOC relationship is updated according to the first voltage difference of the battery. The present disclosure further determines the SOC-3 according to the first SOC and the second SOC. Thus, the present disclosure determines the current SOC of the battery according to the previous SOC of the battery and the previous actual capacity of the battery, and uses the current SOC of the battery and the current actual capacity of the battery as inputs to determine a next SOC of the battery. Simultaneously, the present disclosure further determines the SOC of the battery during the battery discharging period according to the previous SOC of the battery and a previous actual capacity of the battery, determines the first voltage difference of the battery during the battery discharging period according to the SOC of the battery during the battery discharging period, and updates the VD vs. SOC relationship according to the first voltage difference of the battery.

The method for updating voltage difference of the battery can include the following:

Step S21, presetting the VD vs. SOC relationship.

Figure 3:
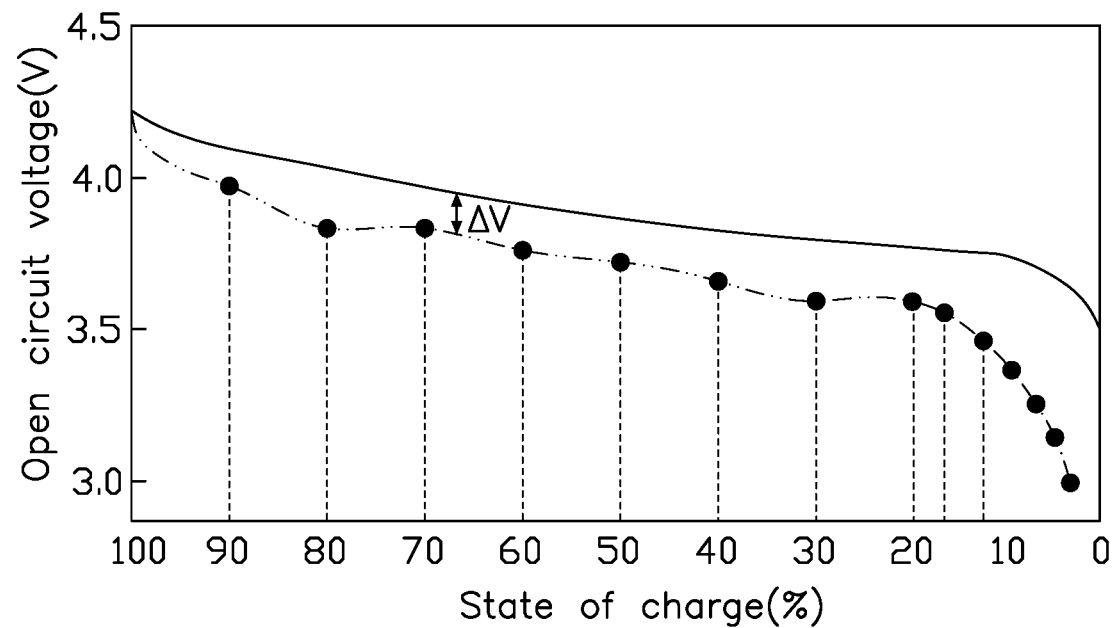
FIG. 3 is a chart illustrating relationship of VD vs. SOC.

The VD vs. SOC relationship can be a graph, as shown in FIG. 3. The VD vs. SOC relationship includes a base open circuit voltage vs. state of charge curve (hereinafter base OCV vs. SOC curve) and a first OCV vs. SOC curve. The first OCV vs. SOC curve is measured in a laboratory. The base OCV vs. SOC curve is represented by a solid line, the first OCV vs. SOC curve is represented by a dot and dash line. The Av in FIG. 3 represents a voltage difference between the base OCV vs. SOC curve and the first OCV vs. SOC curve at same SOC of the battery. In other embodiments, the VD vs. SOC relationship can be a relation table, or the like. In the embodiment, presetting the VD vs. SOC relationship includes presetting the VD vs. SOC relationship at a plurality of different temperatures.

Step S22, detecting a SOC-1.

In the embodiment, the SOC-1 can be detected by obtaining. The SOC-1 can be the SOC-1 calculated by another system within the electronic device, the SOC-1 calculated by an external electronic device, or the SOC-1 calculated via any well-known method by the present method.

In the embodiment, the SOC-1 can be detected by calculating. The method for updating voltage difference of battery further includes:

a1: detecting the SOC-2 and the actual capacity-1 of the battery.

In the embodiment, the SOC-2 and the actual capacity-1 of the battery can be detected by calculating an initialized SOC and obtaining a preset capacity. In the embodiment, the calculating an initialized SOC includes:

b1: determining a first OCV.

Determining a first OCV includes determining that the first OCV is a current battery voltage. In the embodiment, before detecting the SOC-2 and the actual capacity-1 of the battery, the method further includes: detecting a current battery voltage, a current battery current, and a current battery temperature. Detecting a current battery voltage, a current battery current, and a current battery temperature includes obtaining the current battery voltage and the current battery current via the analog to digital converter, and obtaining the current battery temperature via the sensor.

In the embodiment, detecting a current battery voltage, a current battery current, and a current battery temperature can be done by obtaining the current battery voltage $V_{bat}$, the current battery current $I_{bat}$, and the current battery temperature $T_{bat}$ at a preset time interval or at random. Preferably, the preset time interval can be ten seconds or another value according to specific requirements. The random obtaining can be by obtaining at a first preset time interval during a period of time and obtaining at a second preset time interval during other period of time. Thus, the method can automatically adjust time interval for detecting the current battery voltage, the current battery current, and the current battery temperature according to need.

In the embodiment, after detecting a current battery voltage, a current battery current, and a current battery temperature, the method further includes: filtering the signals outputted from the analog to digital converter and the sensor. In the embodiment, filtering the signals outputted from the analog to digital converter and the sensor can include: filtering the signals outputted from the analog to digital converter and the sensor during a first preset period of time after detecting that the battery is switched from the idle state to either the charging state or the discharging state. Preferably, the first preset period of time is six hundred seconds or another value according to specific requirements. Thus, the present disclosure limits a time after the battery switches from the idle state to the discharging state, thereby preventing a load from having an influence when the load is connected to the battery instantaneously.

In the embodiment, filtering the signals outputted from the analog to digital converter and the sensor can further include: when detecting that the battery is switched between the charging state and the discharging state or detecting that the battery is switched to the idle state from either charging state or discharging state, at a first preset time period after detecting that the battery is switched from the idle state to either charging state or discharging state, filtering the signals from the analog to digital converter and the sensor at a second preset period of time. Preferably, the second preset period of time is sixty seconds or another value according to specific requirements.

In the embodiment, filtering the signals outputted from the analog to digital converter and the sensor can further include: employing a first order low pass filtering method to filter the signals outputted from the analog to digital converter and the sensor. The first order low pass filtering method includes: $Y(n)=(1-a) \times X(n) + a \times Y(n-1)$; where, $Y(n)$ is a nth filter output value, a is a filter coefficient, $X(n)$ is a nth output value without filtering, and $Y(n-1)$ is a (n-1)th filter output value.

In the embodiment, determining that the first OCV is a current battery voltage is as follows:

When the battery starts to supply power, the current flowing through the battery is smaller, the initialized voltage of the battery is approximately equal to the current battery voltage. At this moment, ignoring the current when the battery is just powering on when the first OCV is determined via Ohm's law $V_{alid}=V-I*R(SOC,T)$, namely determining that the current when the battery is just powering on is zero. And determining that the first OCV is the current battery voltage. Where, $V_{alid}$ is a first OCV, V is a voltage of the battery when the battery is just powering on, I is a current of the battery when the battery is just powering on, R(SOC, T) is an impedance of the battery when the battery is just powering on, SOC is an SOC of the battery when the battery is just powering on, and T is a temperature of the battery when the battery is just powering on.

b2: determining the initialized SOC according to the first OCV.

Determining the initialized SOC according to the first OCV includes: querying the VD vs. SOC relationship to determine the initialized SOC according to the first OCV. In detail, querying the VD vs. SOC relationship to determine the initialized SOC according to the first OCV includes: querying the base OCV vs. SOC curve of the VD vs. SOC relationship to determine the initialized SOC according to the first OCV. Querying the VD vs. SOC relationship to determine the initialized SOC according to the first OCV includes: querying a first voltage which is in the base OCV vs. SOC curve of the VD vs. SOC relationship and matching the first OCV; and determining that the SOC of the battery in the base OCV vs. SOC curve of the VD vs. SOC relationship and corresponding to the determined first voltage is the initialized SOC.

In the embodiment, querying the VD vs. SOC relationship to determine the initialized SOC according to the first OCV includes: querying a VD vs. SOC relationship at the temperature which is in the VD vs. SOC relationships at the plurality of different temperatures and which has temperature matching the current temperature of the battery; querying a first voltage which is in the base OCV vs. SOC curve of the VD vs. SOC relationship at the temperature and which matches the first OCV; and determining that the SOC of the battery in the base OCV vs. SOC curve of the VD vs. SOC relationship at the temperature and corresponding to the determined first voltage is the initialized SOC.

In the embodiment, the preset capacity is prestored in the battery.

In the embodiment, the SOC-2 and the actual capacity-1 of the battery can be detected by obtaining a calculated SOC-2 and a calculated actual capacity-1 of the battery. The actual capacity-1 of the battery can be the actual capacity-1 of the battery calculated by another system within the electronic device, the actual capacity-1 of the battery calculated by an external electronic device, or the actual capacity-1 of the battery calculated via any well-known method by the present method.

In the embodiment, the method further includes: calculating the actual capacity-2 of the battery. The actual capacity-2 of the battery can be the actual capacity-2 of the battery calculated by another system within the electronic device, by an external electronic device, or by any well-known method by the present method. The actual capacity-2 of the battery is an update relevant to the usage of the battery.

In the embodiment, the actual capacity-1 of the battery employed to calculate the first SOC via the coulomb counting method is the actual capacity-1 of the battery calculated via the present disclosure. Simultaneously, the actual capacity-2 of the battery will act as an actual capacity-1 of the battery employed to calculate a next battery actual capacity via the coulomb counting method.

In the embodiment, detecting the SOC-2 and the actual capacity-1 of the battery can be by obtaining the calculated SOC-2 and obtaining the preset capacity. The actual capacity-1 of the battery is the preset capacity.

a2: determining the first SOC according to the SOC-2 and the actual capacity-1 of the battery.

In the embodiment, the method further includes: detecting a state of the battery. The state of the battery can be the charging state, or the discharging state, or the idle state. In the embodiment, determining that the battery is in a charging state when an increase of the current battery voltage is greater than a preset value of variation is detected. Preferably, the preset value of variation is four microvolts per second or another value according to specific requirements. In the embodiment, determining that the battery is in a discharging state when a decrease of the current battery voltage is greater than the preset variation value. In the embodiment, determining that the battery is in an idle state when a value of variation of the current battery voltage is less than the preset value of variation. In the embodiment, detecting whether the current battery voltage is collected at the first time or whether the increase or the decrease relative to the previous obtaining voltage of the battery is greater than the preset value of variation. Determining that the increase of the current battery voltage being greater than the preset variation value is detected when detecting that the current battery voltage is collected at the first time or the increase relative to the previous obtaining voltage of the battery is greater than the preset value of variation. Determining that the decrease of the current battery voltage being greater than the preset value of variation is detected when detecting that the decrease between the current battery voltage and the previous obtaining voltage of the battery is greater than the preset value of variation. Determining that the value of variation of the current battery voltage being less than the preset variation value is detected when detecting that the variation between the current battery voltage and the previous obtaining voltage of the battery is less than the preset value of variation.

In the embodiment, the method further includes: updating the first SOC according to the SOC-2 and the actual capacity-1 of the battery if the battery is in the charging state or the discharging state, and keeping the value of the first SOC if the battery is in the idle state. Namely, in the embodiment, the first SOC updates only when the battery is in either charging state or discharging state. In the embodiment, the method can further include: stopping the calculation of the first SOC when the battery is in the idle state.

In the embodiment, determining the first SOC according to the SOC-2 and the actual capacity-1 of the battery includes: determining the first SOC according to the SOC-2 and the actual capacity-1 of the battery via the coulomb counting method. Determining the first SOC according to the SOC-2 and the actual capacity-1 of the battery via the coulomb counting method includes:

Determining the first SOC according to the SOC-2, the current battery current, a difference between current time and a previous time (a sampling interval) of obtaining the battery current, and the actual capacity-1 of the battery via the coulomb counting method.

In the embodiment, the coulomb counting method includes: $SOC_1 = SOC_0 + I_{bat} \times \Delta t / Q_{abs}$; where $SOC_1$ is the first SOC, $SOC_0$ is the SOC-2, $I_{bat}$ is the current battery current, $\Delta t$ is the sampling interval of obtaining the battery current, and $Q_{abs}$ is the actual capacity-1 of the battery.

In the embodiment, the SOC-2 is the initialized SOC and the actual capacity-1 of the battery is the preset capacity when the first SOC is determined for the first time. The SOC-2 is the calculated SOC-2 and the actual capacity-1 of the battery is the calculated actual capacity-1 of the battery when the first SOC is not determined for the first time. The calculated SOC-2 can be the second SOC calculated via Ohm's law at the idle state before the battery enters either charging state or discharging state, or the second SOC calculated via the coulomb counting method when the battery is in either charging state or discharging state. The actual capacity-1 of the battery can be the actual capacity-1 of the battery calculated when the battery is in the charging state, the discharging state, or the idle state.

a3: determining the SOC-1 according to the first SOC.

In the embodiment, determining the SOC-1 according to the first SOC includes: updating the SOC-1 to be the first SOC if the battery is in the discharging state, and stopping the update of the SOC-1 if the battery is in the charging state. In the embodiment, the method for updating voltage difference of battery further includes:

c1: determining the second SOC according to the SOC-2.

In the embodiment, the method further includes: stopping the update of the second SOC when the battery is in either charging state or discharging state, and updating the second SOC according to the SOC-2 when the battery is in the idle state. Namely, in the embodiment, the second SOC updates only when the battery is in the idle state. In the embodiment, the method can further include: stopping the calculation of the second SOC when the battery is in either charging state or discharging state.

In the embodiment, determining the second SOC according to the SOC-2 includes: determining the second SOC according to the SOC-2 via Ohm's law. In the embodiment, determining the second SOC according to the SOC-2 via Ohm's law includes:

d1: determining the impedance of the battery according to the SOC-2.

In the embodiment, determining the impedance of the battery according to the SOC-2 includes: querying a prestored relation table regarding the impedance of the battery, the SOC of the battery, and the temperature of the battery to determine the impedance of the battery according to the SOC-2 and the current battery temperature. Querying a prestored relation table regarding the impedance of the battery, the SOC of the battery, and the temperature of the battery to determine the impedance of the battery according to the SOC-2 and the current battery temperature includes:

Determining the SOC of the battery and the temperature of the battery which are in the prestored relation table regarding the impedance of the battery, the SOC of the battery, and the temperature of the battery, and respectively matching the SOC-2 and the current battery temperature. Determining that the impedance of the battery in the prestored relation table regarding the impedance of the battery, the SOC of the battery, and the temperature of the battery and corresponding to the determined SOC of the battery and the determined temperature of the battery is the aforementioned impedance of the battery.

d2: determining an OCV via $V_{alid\_OCV} = V_{bat} - I_{bat} * R(SOC, T_{bat})$, wherein $V_{bat}$ is the current battery voltage, $I_{bat}$ is the current battery current, and $R(SOC, T_{bat})$ is the impedance of the battery.

d3: determining the second SOC according to the OCV.

Determining the second SOC according to the OCV includes: querying the VD vs. SOC relationship to determine the second SOC according to the OCV. In the embodiment, querying the VD vs. SOC relationship to determine the second SOC according to the OCV can include: querying a second voltage which is in the base OCV vs. SOC curve of the VD vs. SOC relationship and matching the OCV; and determining that the SOC of the battery in the base OCV vs. SOC curve of the VD vs. SOC relationship and corresponding to the determined second voltage is the second SOC.

In the embodiment, querying the VD vs. SOC relationship to determine the second SOC according to the OCV can further include: querying a VD vs. SOC relationship at the temperature which is in the VD vs. SOC relationship at the plurality of different temperatures and which has temperature matching the current temperature of the battery; querying a second voltage which is in the base OCV vs. SOC curve of the VD vs. SOC relationship at the temperature and which matches the OCV; and determining that the SOC of the battery in the base OCV vs. SOC curve of the VD vs.

SOC relationship at the temperature and corresponding to the determined second voltage is the second SOC.

c2: determining a SOC-3 according to the first SOC and the second SOC.

Figure 4:
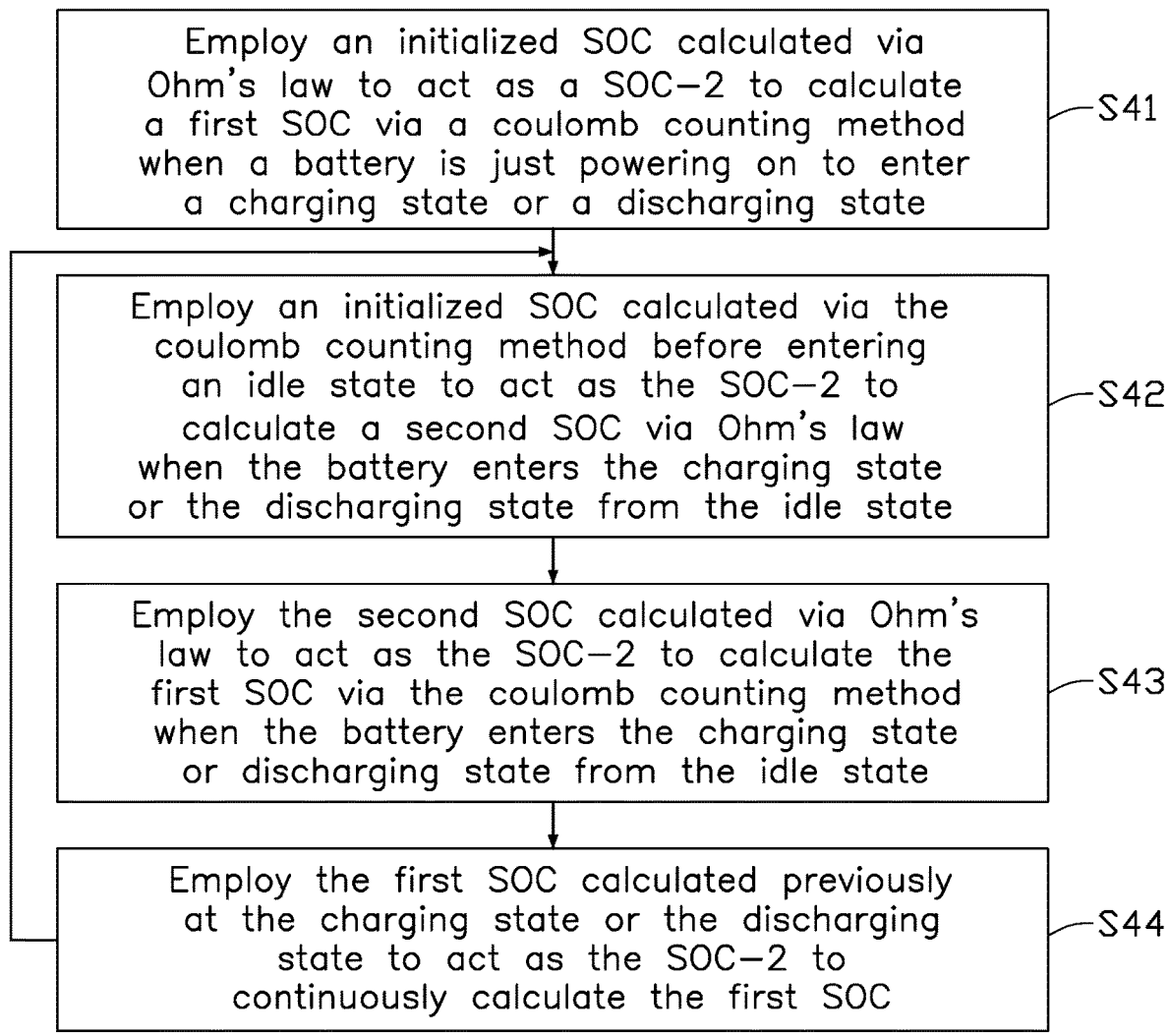
FIG. 4 is a flowchart illustrating and describing a process for iteratively calculating an SOC of a battery via a first SOC calculated via a coulomb counting method and a second SOC calculated via Ohm's law.

In the embodiment, the SOC of the battery is iteratively calculated via the first SOC calculated via the coulomb counting method and the second SOC calculated via Ohm's law. Namely, as shown in FIG. 4, the method includes when the battery enters the charging state or the discharging state from the idle state or when the battery is just starting to enter into the charging state or the discharging state, the second SOC calculated via the Ohm's law or the initialized SOC calculated via the Ohm's law acts as the SOC-2 to calculate the first SOC via the coulomb counting method. The first SOC calculated previously at the charging state or the discharging state acts as the SOC-2 to enable continuous calculation of the first SOC. When the battery enters the idle state from the charging state or the discharging state, the first SOC calculated via the coulomb counting method before entering the idle state acts as the SOC-2 to calculate the second SOC via Ohm's law.

In detail, the SOC of the battery being iteratively calculated via the first SOC calculated via the coulomb counting method and the second SOC calculated via Ohm's law can include the following steps:

Step S41: employing the initialized SOC calculated via Ohm's law to act as the SOC-2 to calculate the first SOC via the coulomb counting method when the battery is just powering on to enter the charging state or the discharging state.

Step S42: employing the initialized SOC calculated via the coulomb counting method before entering the idle state to act as the SOC-2 to calculate the second SOC via Ohm's law when the battery enters the charging state or the discharging state from the idle state.

Step S43: employing the second SOC calculated via Ohm's law to act as the SOC-2 to calculate the first SOC via the coulomb counting method when the battery enters the charging state or discharging state from the idle state.

Step S44: employing the first SOC calculated previously at the charging state or the discharging state to act as the SOC-2 to continuously calculate the first SOC. After executing step S44, continuously executing step S42.

Obviously, the present disclosure is not limited to the aforementioned detail embodiment, there may be other variations, for example, after step S41, the method can further comprise: employing the first SOC calculated previously at the charging state or the discharging state to act as the SOC-2 to continuously calculate the first SOC, or the step S44 can be omitted.

In the embodiment, the method further includes: determining the SOC-3 according to the first SOC and the second SOC. Determining the SOC-3 according to the first SOC and the second SOC includes: determining that the SOC-3 is the first SOC when the first SOC is updated, and determining that the SOC-3 is the second SOC when the second SOC is updated.

Step S23, determining the first voltage difference of the battery according to the SOC-1.

In the embodiment, determining the first voltage difference of the battery according to the SOC-1 can include: determining the first voltage difference of the battery when the battery is discharged at a plurality of different rates according to the SOC-1. Determining the first voltage difference of the battery when the battery is discharged at the plurality of different rates according to the SOC-1 can be by controlling the battery to run one or more cycles to determine the first voltage difference of the battery when the battery is discharged at the plurality of different rates according to the SOC-1. At each cycle of the battery, the discharge rate of the battery can be unvarying or varying. For example, in a first cycle of the battery, the discharge rate of the battery is always 0.2 C, in a second cycle of the battery, the discharge rate of the battery is 0.1 C and 0.2 C. In the cycles of the battery, the discharge rates of the battery for different cycles can be partly same. For example, in a third cycle of the battery, the discharge rate of the battery is always 0.2 C, in a fourth cycle of the battery, the discharge rate of the battery is 0.3 C and 0.2 C. Thus, by determining the first voltage difference of the battery when the battery is discharged at the plurality of different rates according to the SOC-1, the present disclosure can determine the first voltage difference of the battery at each of the plurality of different temperatures and at a preset discharge rate according to the SOC-1. In the embodiment, determining the first voltage difference of the battery according to the SOC-1 includes: determining the first voltage difference of the battery during the battery discharging period according to the SOC-1.

Determining the first voltage difference of the battery during the battery discharging period according to the SOC-1 includes:

f1: determining a second OCV according to the SOC-1.

In the embodiment, determining a second OCV according to the SOC-1 includes:

querying the VD vs. SOC relationship to determine the second OCV according to the SOC-1.

In the embodiment, querying the VD vs. SOC relationship to determine the second OCV according to the SOC-1 can include: querying a fourth battery SOC which is in the base OCV vs. SOC curve of the VD vs. SOC relationship and which matches the SOC-1; and determining that the OCV in the base OCV vs. SOC curve of the VD vs. SOC relationship and corresponding to the determined fourth battery SOC is the second OCV.

In the embodiment, querying the VD vs. SOC relationship to determine the second OCV according to the SOC-1 can include: querying a VD vs. SOC relationship at the temperature which is in the VD vs. SOC relationship at the plurality of different temperatures and which has temperature matching the current temperature of the battery; querying the SOC of the battery which is in the base OCV vs. SOC curve of the VD vs. SOC relationship at the temperature and which matches the first OCV; and determining that the OCV of the battery in the base OCV vs. SOC curve of the VD vs. SOC relationship at the temperature and corresponding to the determined SOC of the battery is the second OCV.

f2: determining the first voltage difference of the battery during the battery discharging period according to the second OCV.

In the embodiment, determining the first voltage difference of the battery during the battery discharging period according to the second OCV includes: determining that the first voltage difference of the battery during the battery discharging period is a value of difference between the second OCV and the current battery voltage.

Step S24, updating the VD vs. SOC relationship according to the first voltage difference of the battery.

In the embodiment, updating the VD vs. SOC relationship according to the first voltage difference of the battery includes:

g1: processing the first voltage difference of the battery via a monadic linear regression method to determine a second voltage difference of the battery.

In the embodiment, processing the first voltage difference of the battery via a monadic linear regression method to determine a second voltage difference of the battery includes: processing the first voltage difference of the battery via the monadic linear regression method to determine the second voltage difference of the battery when the SOC during the calculation of the first voltage difference of the battery is one of a number of preset values. Preferably, the preset values are 100%, 90%, 80%, 70%, 60%, 50%, 40%, 30%, 20%, 12%, 4%, 0%, or other values according to specific requirements.

In the embodiment, before processing the first voltage difference of the battery via a monadic linear regression method to determine a second voltage difference of the battery, the method further includes: setting the preset values according to the battery SOC. In detail, the method further includes: setting the preset values at a first preset interval when the SOC of the battery is in a first preset range, and setting the preset values at a second preset interval when the SOC of the battery is in a second preset range. Preferably, the first preset range is 20%-100%, or may be another value according to specific requirements. Preferably, the first preset interval is 10%, or may be another value according to specific requirements. Preferably, the second preset range is 0%~20%, or may be another value according to specific requirements. Preferably, the second preset interval is 8%, or may be another value according to specific requirements. Thus, when the SOC of the battery is in the second preset range, by setting the preset value to a smaller interval, a large jump or hopping of the voltage difference of the battery caused by a large variation of the voltage difference of the battery at a discharge terminal can be avoided.

In the embodiment, the monadic linear regression method includes: y=w×x+b; where $$w = \frac{\sum_{i=1}^{n} y_i \left(x_i - \frac{1}{n}\sum_{i=1}^{n} x_i\right)}{\sum_{i=1}^{n} x_i^2 - \left(\frac{1}{n}\sum_{i=1}^{n} x_i\right)^2}; b = \frac{1}{n}\sum_{i=1}^{n} y_i - w \times \frac{1}{n}\sum_{i=1}^{n} x_i.$$

Where, y is the second voltage difference of the battery, x is a variation value between the first SOC of the battery at a current linear regression and the first SOC of the battery at a previous linear regression, n is a number of the first voltage difference of the battery between the current linear regression and the previous linear regression, $y_i$ is an ith first voltage difference of the battery, and $x_i$ is an ith SOC-1.

g2: updating the VD vs. SOC relationship according to the second voltage difference of the battery.

In the embodiment, before updating the VD vs. SOC relationship according to the second voltage difference of the battery, the method includes: employing a first order low pass filtering method to filter the second voltage difference of the battery. The first order low pass filtering method includes: ΔVnew(n)=(1−a)×ΔVnew+a×ΔVold(n). Where, ΔVnew(n) is an nth filter output value of the second voltage difference of the battery, a is a filter coefficient, ΔVnew is a nth output value of the second voltage difference of the battery without filtering, and ΔVold(n) is an nth filter output value of the voltage difference of the battery in the preset VD vs. SOC relationship. Thus, by filtering the second voltage difference of the battery, jumping or hopping during subsequent update of the VD vs. SOC relationship can be avoided.

In the embodiment, before updating the VD vs. SOC relationship according to the second voltage difference of the battery, the method further includes: determining that an absolute value of a difference between the second voltage difference of the battery and the third voltage difference of the battery is less than an allowable maximum voltage difference.

In the embodiment, updating the VD vs. SOC relationship according to the second voltage difference of the battery can include: updating the VD vs. SOC relationship according to the second voltage difference of the battery if the absolute value of the difference between the second voltage difference of the battery and the third voltage difference of the battery is less than the allowable maximum voltage difference.

In the embodiment, updating the VD vs. SOC relationship according to the second voltage difference of the battery can include: updating the second voltage difference of the battery to be a total of the third voltage difference of the battery and the allowable maximum voltage difference if the absolute value of the difference between the second voltage difference of the battery and the third voltage difference of the battery is greater than or equal to the allowable maximum voltage difference. Then updating the VD vs. SOC relationship according to the second voltage difference of the battery.

In the embodiment, the third voltage difference of the battery is a current voltage difference of the battery in the preset VD vs. SOC relationship. Thus, by limiting the variation between the current second voltage difference of the battery and the current voltage difference of the battery in the preset VD vs. SOC relationship, the variation relative to the voltage difference in the preset VD vs. SOC relationship when updating is prevented, reinforcing the robustness of the method.

In the embodiment, updating the VD vs. SOC relationship according to the second voltage difference of the battery can include: querying a fifth battery SOC which is in the base OCV vs. SOC curve of the VD vs. SOC relationship and which matches the SOC-1 during calculation of the second voltage difference of the battery, and determining that the OCV in the base OCV vs. SOC curve of the VD vs. SOC relationship and which corresponds to the determined fifth battery SOC is the third OCV. Updating the VD vs. SOC relationship according to the second voltage difference of the battery further includes: determining a fourth OCV according to the second voltage difference of the battery and the third OCV, and updating the first OCV vs. SOC curve of the VD vs. SOC relationship according to the fourth OCV.

Figure 5:
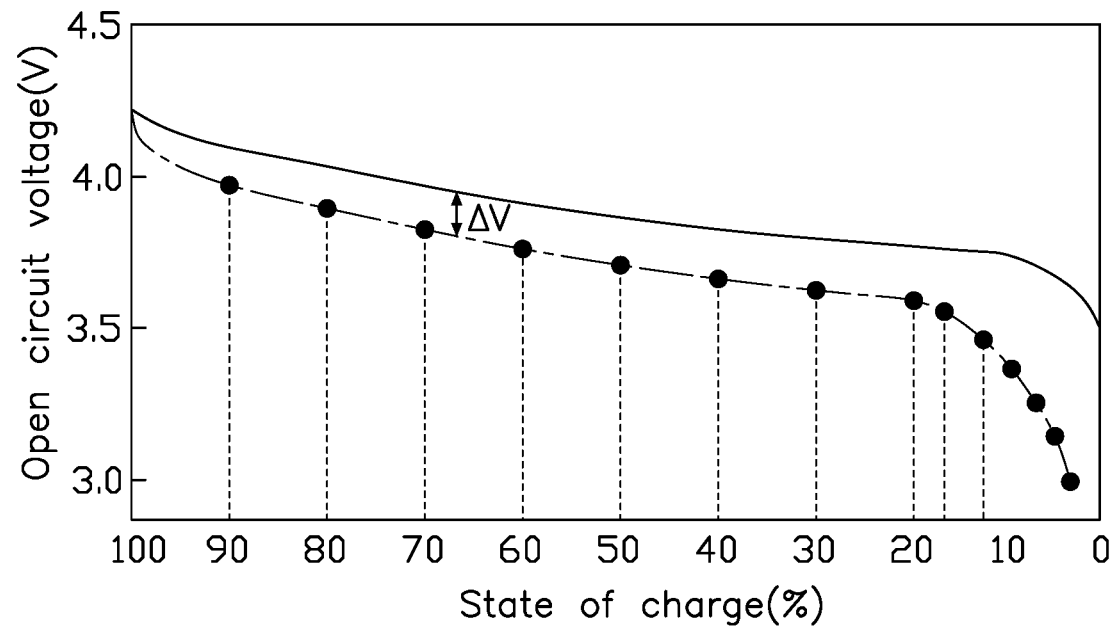
FIG. 5 is a chart showing an updated VD vs. SOC relationship.

As shown in FIG. 5, a curve represented by an unbroken line is the base OCV vs. SOC curve. A curve represented via the dot and dash line is the updated first OCV vs. SOC curve, and Av represents the second voltage difference of the battery between the base OCV vs. SOC curve and the updated first OCV vs. SOC curve at same SOC of the battery.

In the embodiment, determining a fourth OCV according to the second voltage difference of the battery and the third OCV includes: determining that the fourth OCV is a difference value between the third OCV and the second voltage difference of the battery.

In the embodiment, updating the VD vs. SOC relationship according to the fourth OCV includes: updating that the OCV which corresponds to the fifth battery SOC as the fourth OCV in the VD vs. SOC relationship.

In the embodiment, updating the VD vs. SOC relationship according to the first voltage difference of the battery includes: updating the VD vs. SOC relationship at each of the plurality of different temperatures according to the first voltage difference of the battery and the current battery temperature.

In the embodiment, updating the VD vs. SOC relationship at each of the plurality of different temperatures according to the first voltage difference of the battery and the current battery temperature includes: querying a VD vs. SOC relationship at the temperature within the VD vs. SOC relationship at the plurality of different temperatures and which has a temperature matching the current temperature of the battery. Updating the VD vs. SOC relationship at each of the plurality of different temperatures according to the first voltage difference of the battery and the current battery temperature further includes: querying a fifth battery SOC which is in the base OCV vs. SOC curve of the VD vs. SOC relationship at the temperature and which matches the SOC-1 and determining that the OCV in the base OCV vs. SOC curve of the VD vs. SOC relationship at the temperature and corresponding to the fifth battery SOC as determined, is the third OCV. Updating the VD vs. SOC relationship at each of the plurality of different temperatures according to the first voltage difference of the battery and the current battery temperature further includes: determining the fourth OCV according to the second voltage difference of the battery and the third OCV and updating the first OCV-SOC curve of the VD vs. SOC relation at the temperature according to the fourth OCV.

In the embodiment, updating the first OCV-SOC curve of the VD vs. SOC relation at the temperature according to the fourth OCV includes: updating the OCV in the first OCV-SOC curve of the VD vs. SOC relation at the temperature and corresponding to the fifth battery SOC is the fourth OCV.

Updating the VD vs. SOC relationship according to the first voltage difference of the battery includes: updating the VD vs. SOC relationship at each of the plurality of different temperatures and at the preset discharge rate according to the first voltage difference of the battery and the current battery temperature.

Figure 6:
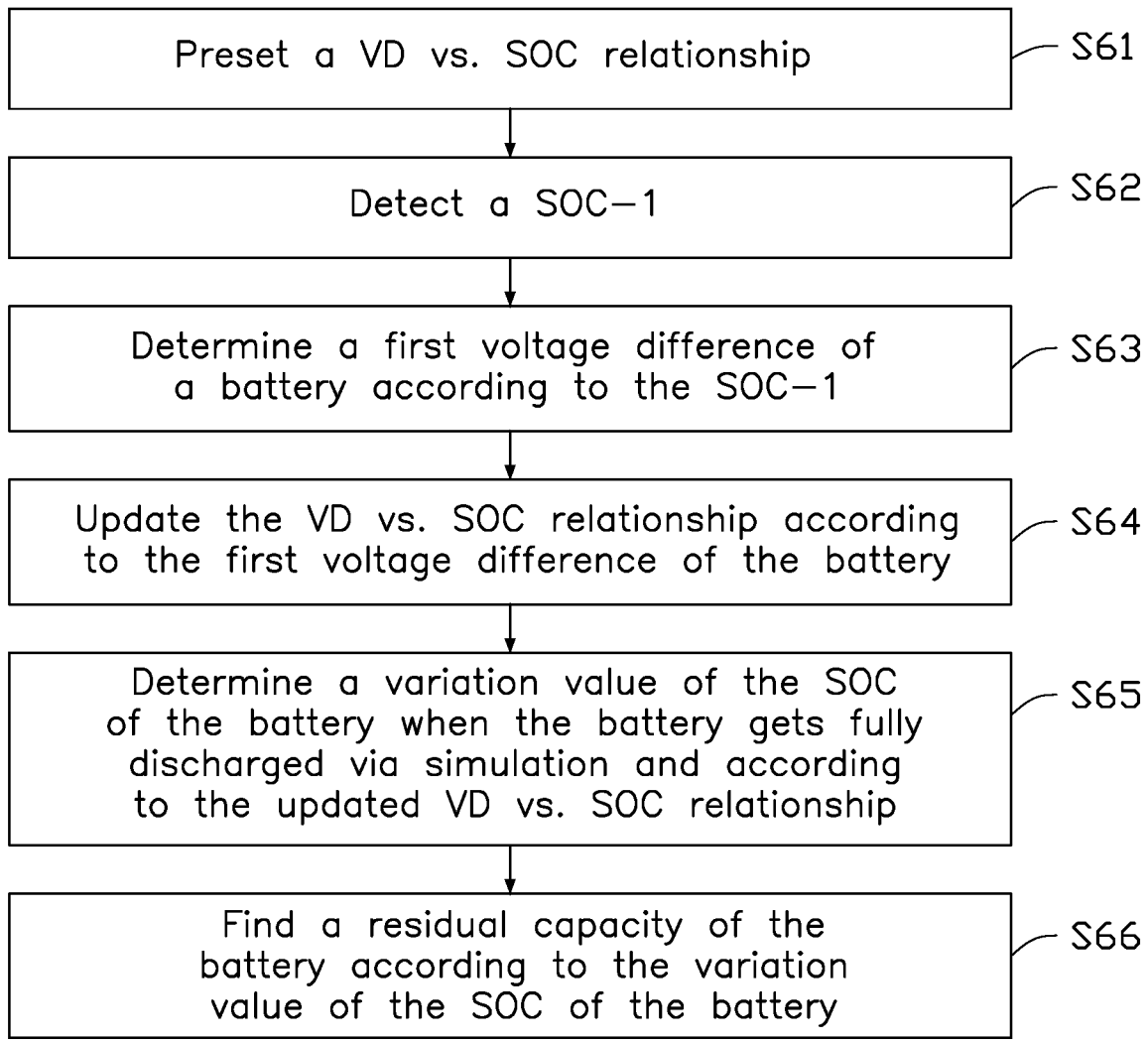
FIG. 6 is a flowchart of a method for estimating state of charge.

FIG. 6 is a flowchart of a method for estimating state of charge. A SOC-1 of the present disclosure is an SOC of the battery during the battery discharging period, a SOC-2 is a previous SOC of the battery, and a SOC-3 is a current SOC of the battery. An actual capacity-1 of the battery is a previous actual capacity of the battery, and an actual capacity-2 of the battery is a current actual capacity of the battery. A first SOC is the SOC calculated during a charge-discharging state via a coulomb counting method, and a second SOC is the SOC calculated during the idle state via Ohm's law.

The present disclosure presets a VD vs. SOC relationship, detects the SOC-2 and the actual capacity-1 of the battery, determines the second SOC according to the SOC-2, and determines the first SOC according to the SOC-2 and the actual capacity-1 of the battery. The method further determines the SOC-1 according to the first SOC, determines a first voltage difference of the battery according to the SOC-1; and updates the VD vs. SOC relationship according to the first voltage difference of the battery. Simultaneously, the present disclosure determines a variation value of the SOC of the battery when the battery gets fully discharged from an beginning of the simulation according to the updated VD vs. SOC relationship and via discharge simulation; and estimates a residual capacity of the battery according to the variation value of the SOC of the battery. The present disclosure further determines a SOC-3 according to the first SOC and the second SOC.

Thus, the present disclosure determines the current SOC of the battery according to the previous SOC of the battery and the previous actual capacity of the battery, and uses the current SOC of the battery and the current actual capacity of the battery as inputs to determine a next SOC of the battery. Simultaneously, the present disclosure further determines the first SOC of the battery during the battery discharging period according to the previous SOC of the battery and a previous actual capacity of the battery, determines the first voltage difference of the battery during the battery discharging period according to the SOC of the battery during the battery discharging period, and updates the VD vs. SOC relationship according to the first voltage difference of the battery during the battery discharging period. The present disclosure further determines the variation value of the SOC of the battery when the battery is discharged to the voltage when the battery gets fully discharged via simulation and according to the updated VD vs. SOC relationship; and estimates the residual capacity of the battery according to the variation value of the SOC of the battery.

The method for estimating state of charge can include the following:

Step S61, presetting the VD vs. SOC relationship.

In the embodiment, the step S61 of the method for estimating state of charge is the same as the step S21 of the method for updating voltage difference of the battery, reference can be made to the related description of the step S21 of the method for updating voltage difference of the battery, which will not be described herein.

Step S62, detecting a SOC-1.

In the embodiment, the step S62 of the method for estimating state of charge is the same as the step S22 of the method for updating voltage difference of the battery, reference can be made to the related description of the step S22 of the method for updating voltage difference of the battery, which will not be described herein.

Step S63, determining the first voltage difference of the battery according to the SOC-1.

In the embodiment, the step S63 of the method for estimating state of charge is the same as the step S23 of the method for updating voltage difference of the battery, reference can be made to the related description of the step S23 of the method for updating voltage difference of the battery, which will not be described herein.

Step S64, updating the VD vs. SOC relationship according to the first voltage difference of the battery.

In the embodiment, the step S64 of the method for estimating state of charge is the same as the step S24 of the method for updating voltage difference of the battery, reference can be made to the related description of the step S24 of the method for updating voltage difference of the battery, which will not be described herein.

Step S65, determining a variation value of the SOC of the battery when the battery gets fully discharged via simulation and according to the updated VD vs. SOC relationship.

Figure 7:
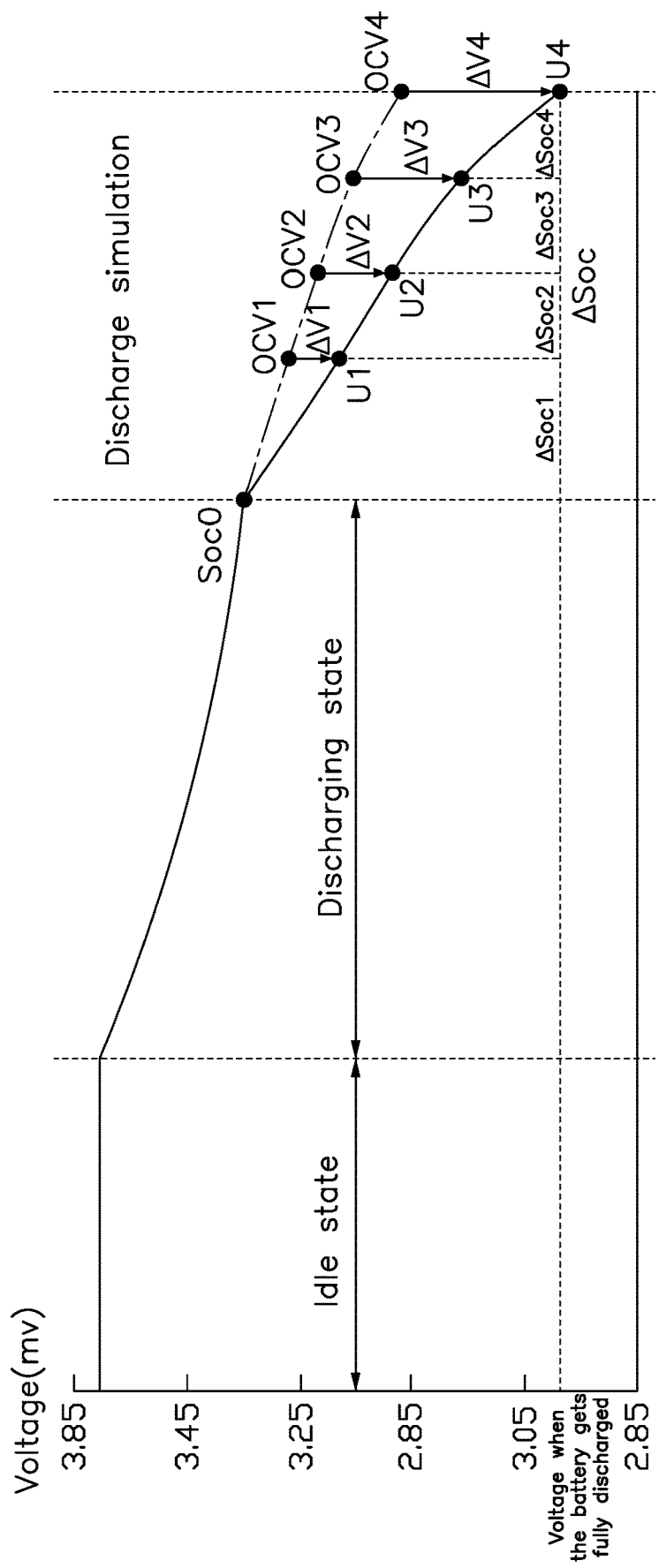
FIG. 7 is a view showing a simulation of a battery.

In the embodiment, referring also to FIG. 7, determine a variation value of the SOC of the battery when the battery gets fully discharged via simulation and according to the updated VD vs. SOC relationship includes:

h1: updating a ratio coefficient table at a preset discharge rate between each first voltage difference of the battery corresponding to each of variation SOCs of the battery at each of variation temperatures and the first voltage difference of the battery corresponding to each of variation SOCs of the battery at preset temperature according to the updated VD vs. SOC relationship.

In the embodiment, the electronic device stores VD vs. SOC relationship at preset temperature and at preset discharge rate, as shown in Table one.

TABLE ONE

| SOC (%) | 0 | 4 | 12 | 20 | 30 | 40 | 50 | 60 | 70 | 80 | 90 | 100 |
|---|---|---|---|---|---|---|---|---|---|---|---|---|
| ΔV | ΔV1 | ΔV2 | ΔV3 | ΔV4 | ΔV5 | ΔV6 | ΔV7 | ΔV8 | ΔV9 | ΔV10 | ΔV11 | ΔV12 |

Preferably, the preset discharge rate is 0.2 C or another value according to specific requirements. Preferably, the preset temperature is 25° C. or another value according to specific requirements.

In the embodiment, the electronic device further stores a ratio coefficient table at a preset discharge rate between each first voltage difference of the battery corresponding to each of variation SOCs of the battery at each of variation temperatures and the first voltage difference of the battery corresponding to each of variation SOCs of the battery at preset temperature, as shown in Table two.

TABLE TWO

| | SOC (%) | | | | | | | | | | | |
|---|---|---|---|---|---|---|---|---|---|---|---|---|
| T° C. | 0 | 4 | 12 | 20 | 30 | 40 | 50 | 60 | 70 | 80 | 90 | 100 |
| 50 | K01 | K02 | K03 | K04 | K05 | K06 | K07 | K08 | K09 | K010 | K011 | K012 |
| 35 | K11 | K12 | K13 | K14 | K15 | K16 | K17 | K18 | K19 | K110 | K111 | K112 |
| 25 | 1 | 1 | 1 | 1 | 1 | 1 | 1 | 1 | 1 | 1 | 1 | 1 |
| 15 | K21 | K22 | K23 | K24 | K25 | K26 | K27 | K28 | K29 | K210 | K211 | K212 |
| 10 | K31 | K32 | K33 | K34 | K35 | K36 | K37 | K38 | K39 | K310 | K311 | K312 |
| 5 | K41 | K42 | K43 | K44 | K45 | K46 | K47 | K48 | K49 | K410 | K411 | K412 |
| 0 | K51 | K52 | K53 | K54 | K55 | K56 | K57 | K58 | K59 | K510 | K511 | K512 |
| −5 | K61 | K62 | K63 | K64 | K65 | K66 | K67 | K68 | K69 | K610 | K611 | K612 |
| −10 | K71 | K72 | K73 | K74 | K75 | K76 | K77 | K78 | K79 | K710 | K711 | K712 |

Preferably, the preset discharge rate is 0.2 C or another value according to specific requirements. Preferably, the preset temperature is 25° C. or another value according to specific requirements.

In the embodiment, updating the ratio coefficient table at a preset discharge rate between each first voltage difference of the battery corresponding to each of variation SOCs of the battery at each of variation temperatures and the first voltage difference of the battery corresponding to each of variation SOCs of the battery at preset temperature according to the updated VD vs. SOC relationship includes: updating the ratio coefficient table at a preset discharge rate between the first voltage difference of the battery corresponding to each of variation SOCs of the battery at each of the variation temperatures and the first voltage difference of the battery corresponding to each of variation SOCs of the battery at preset temperature according to the updated VD vs. SOC relationship at each of the plurality of different temperatures and at the preset discharge rate.

In detail, updating the ratio coefficient table at the preset discharge rate between the first voltage difference of the battery corresponding to each of variation SOCs of the battery at each of the variation temperatures and the first voltage difference of the battery corresponding to each of variation SOCs of the battery at preset temperature according to the updated VD vs. SOC relationship at each of the plurality of different temperatures and at the preset discharge rate and the VD vs. SOC relationship at the preset temperature and at the preset discharge rate.

h2: determining the variation value of the SOC of the battery when the battery gets fully discharged via simulation and according to the updated ratio coefficient table.

Figure 8:
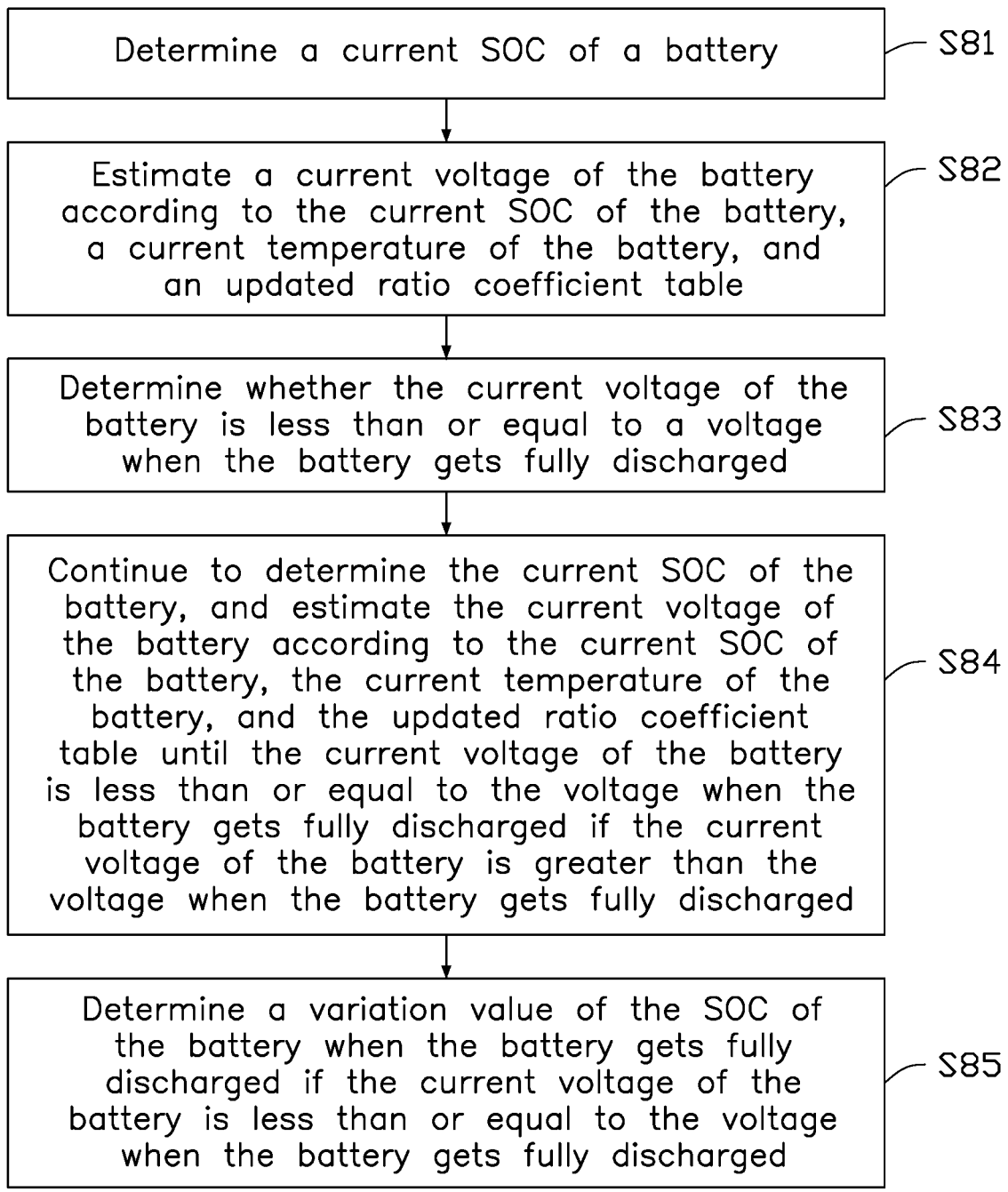
FIG. 8 is a flowchart illustrating and describing a process for determining a variation value of a SOC of a battery when the battery gets fully discharged via simulation according to an updated ratio coefficient table.

Referring also to FIG. 8, determining the variation value of the SOC of the battery when the battery gets fully discharged via simulation and according to the updated ratio coefficient table includes:

Step S81: determining a current SOC of the battery.

In the embodiment, determining a current SOC of the battery includes: detecting a previous SOC of the battery; and estimating a current SOC of the battery according to the previous SOC of the battery.

In the embodiment, the method further includes: simulating a discharge of the battery at preset SOC interval or at random SOC interval of the battery. Preferably, the preset SOC interval of the battery can be 3% or another value according to specific requirements. The random SOC interval of the battery can be simulating a discharge of the battery at a first preset SOC interval of the battery during a period of time and simulating a discharge of the battery at a second preset SOC interval of the battery during other period of time. Thus, the method can automatically adjust the SOC interval of the battery during simulating a discharge of the battery according to need.

In the embodiment, estimating a current SOC of the battery according to the previous SOC of the battery includes: estimating the current SOC of the battery to be a difference value between the previous SOC of the battery and the preset SOC interval of the battery.

In the embodiment, when the current voltage of the battery is estimated first time: detecting a previous SOC of the battery includes: detecting the SOC of the battery at the beginning of the simulation; and estimating a current SOC of the battery according to the previous SOC of the battery includes: estimating the current SOC of the battery according to the SOC of the battery at the beginning of the simulation.

In the embodiment, detecting the SOC of the battery at the beginning of the simulation can be iteratively detecting the SOC of the battery at the beginning of the discharge via the first SOC calculated via the coulomb counting method and the second SOC calculated via Ohm's law employed by the present method. Detecting the SOC of the battery at the beginning of the simulation also can be detecting the SOC of the battery at the beginning of the discharge simulation via any well-known method.

Step S82: estimating a current voltage of the battery according to the current SOC of the battery, a current temperature of the battery, and an updated ratio coefficient table.

In the embodiment, before estimating a current voltage of the battery according to the current SOC of the battery, a current temperature of the battery, and an updated ratio coefficient table, the method further includes: estimating the current temperature of the battery.

In the embodiment, estimating the current temperature of the battery includes:

I1: detecting a previous temperature of the battery.

In the embodiment, detecting a previous temperature of the battery when the current temperature of the battery is estimated the first time includes: detecting a temperature of the battery at the beginning of the discharge simulation. Detecting a temperature of the battery at the beginning of the discharge simulation includes: detecting a temperature of the battery at the beginning of the discharge simulation via the sensor. Detecting a previous temperature of the battery when the current temperature of the battery is not estimated the first time includes: obtaining the previous temperature of the battery.

I2: estimating a current variation value of the temperature of the battery.

In the embodiment, estimating a current variation value of the temperature of the battery includes: estimating the current variation value of the temperature of the battery according to an equation $$c \times m \times \frac{dT}{dt} = I^2 \times R + I \times T \times \frac{\partial E}{\partial T} - h \times S \times (T - Tenv),$$

where c is a specific heat capacity of the battery, m is a quality of the battery, $$\frac{dT}{dt}$$

is the variation value of the temperature of the battery, I is a discharge current of the battery, R is a current impedance of the battery, T is the previous temperature of the battery, $$\frac{\partial E}{\partial T}$$

is an entropy coefficient of the battery, h is a heat transfer coefficient of the battery, S is a surface area of the battery, and Tenv is an environment temperature.

In the embodiment, before estimating the current variation value of the temperature of the battery according to an equation $$c \times m \times \frac{dT}{dt} = I^2 \times R + I \times T \times \frac{\partial E}{\partial T} - h \times S \times (T - Tenv),$$

the method further includes: querying the updated VD vs. SOC relationship to estimate a terminal voltage of the battery according to the current SOC of the battery; and estimating the current impedance of the battery according to an equation $$R = \frac{V}{I},$$

where R is the current impedance of the battery, V is the terminal voltage of the battery, and I is the discharge current of the battery.

In the embodiment, the discharge current of the battery is the preset discharge current of the battery, for example 300 mA, 500 mA, 800 mA, or the like.

In the embodiment, querying the updated VD vs. SOC relationship to estimate a terminal voltage of the battery according to the current SOC of the battery includes: querying a seventh battery SOC which is in the base OCV vs. SOC curve of the updated VD vs. SOC relationship and which matches the current SOC of the battery; and determining that the OCV in the base OCV vs. SOC curve of the updated VD vs. SOC relationship and corresponding to the determined seventh battery SOC is the terminal voltage of the battery.

I3: estimating the current temperature of the battery according to the previous temperature of the battery and the current variation value of the temperature of the battery.

In the embodiment, estimating the current temperature of the battery according to the previous temperature of the battery and the current variation value of the temperature of the battery includes: estimating the current temperature of the battery to be a total of the previous temperature of the battery and the current variation value of the temperature of the battery.

Figure 9:
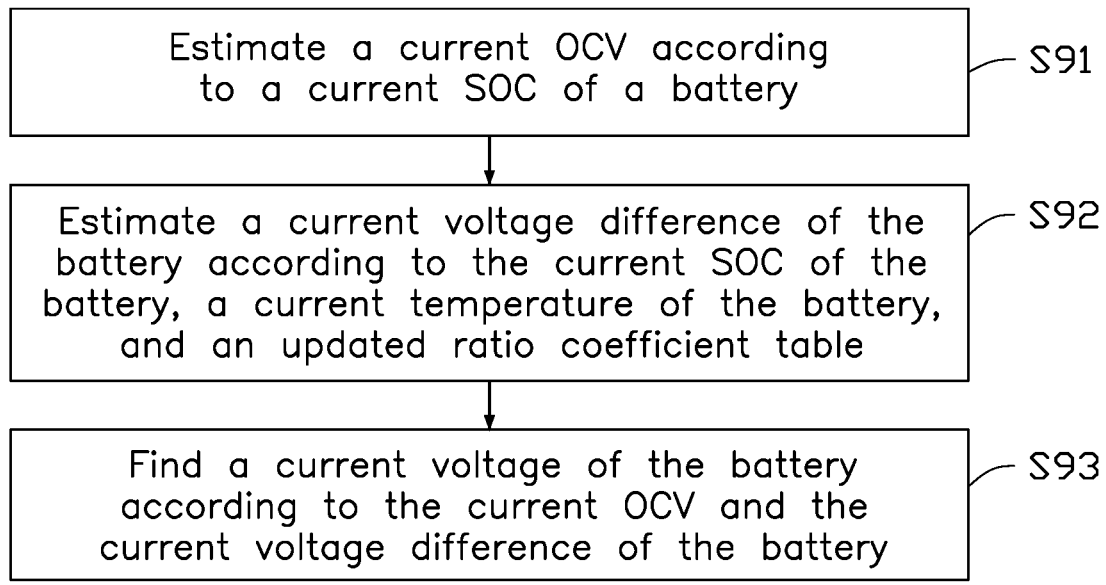
FIG. 9 is a flowchart illustrating and describing a process for estimating a current voltage of a battery according to a current SOC of the battery, a current temperature of the battery, and the updated ratio coefficient table of FIG. 8.

In the embodiment, referring also to FIG. 9, estimating a current voltage of the battery according to the current SOC of the battery, a current temperature of the battery, and an updated ratio coefficient table includes:

Step S91: estimating a current OCV according to the current SOC of the battery.

In the embodiment, estimating a current OCV according to the current SOC of the battery includes: querying the VD vs. SOC relationship to find the current OCV according to the current SOC of the battery. Querying the VD vs. SOC relationship to find the current OCV according to the current SOC of the battery includes: querying a sixth battery SOC which is in the base OCV vs. SOC curve of the VD vs. SOC relationship and which matches the current SOC of the battery; and determining that the OCV in the base OCV vs. SOC curve of the VD vs. SOC relationship and corresponding to the determined sixth battery SOC is the current OCV.

Step S92: estimating a current voltage difference of the battery according to the current SOC of the battery, the current temperature of the battery, and the updated ratio coefficient table.

In the embodiment, estimating a current voltage difference of the battery according to the current SOC of the battery, the current temperature of the battery, and the updated ratio coefficient table includes:

k1: estimating a voltage difference coefficient at a discharge current of the battery according to the updated ratio coefficient table.

In the embodiment, estimating the voltage difference coefficient at the discharge current of the battery according to the updated ratio coefficient table includes: calculating the voltage difference coefficient at the discharge current of the battery according to an equation $$k = K(SOC, T) \times \frac{I}{MC},$$

where k is the voltage difference coefficient at the discharge current of the battery, K(SOC,T) is the updated ratio coefficient table, I is the discharge current of the battery, and MC is the preset discharge rate. For example, the voltage difference coefficient k at the discharge current of the battery is 5K(SOC, T).

In the embodiment, the discharge current of the battery is the preset discharge current of the battery, for example 300 mA, 500 mA, 800 mA, or the like. Preferably, the preset discharge rate is 0.2 C or another value according to specific requirements.

k2: Finding a current voltage difference of the battery according to the current SOC of the battery, the current temperature of the battery, and the voltage difference coefficient.

In the embodiment, finding a current voltage difference of the battery according to the current SOC of the battery, the current temperature of the battery, and the voltage difference coefficient includes: calculating a current voltage difference of the battery according to an equation $\Delta V(SOC,T,I)=\Delta V(SOC,N°C.)\times k$, where $\Delta V(SOC,T,I)$ is the current voltage difference of the battery, $\Delta V(SOC,N°C.)$ is a VD vs. SOC relationship at the preset temperature and at the preset discharge rate, N° C. is the preset temperature, and k is the voltage difference coefficient at the discharge current of the battery.

The present disclosure is not limited to finding a current voltage difference of the battery according to the current SOC of the battery, the current temperature of the battery, and the voltage difference coefficient at k2, there may be other variations, for example, estimating the voltage difference coefficient at a discharge current of the battery according to the current SOC of the battery, the current temperature of the battery, the updated ratio coefficient table at k1, and establishing the current voltage difference of the battery according to the current SOC of the battery, the current temperature of the battery, and the voltage difference coefficient.

Preferably, the preset discharge rate is 0.2 C or another value according to specific requirements. Preferably, the preset temperature is 25° C. or another value according to specific requirements.

Step S93: finding the current voltage of the battery according to the current OCV and the current voltage difference of the battery.

In the embodiment, finding the current voltage of the battery according to the current OCV and the current voltage difference of the battery includes: finding a difference value between the current OCV and the current voltage difference of the battery as the current voltage of the battery.

Step S83: determining whether the current voltage of the battery is less than or equal to a voltage when the battery gets fully discharged.

Preferably, the voltage when the battery gets fully discharged is 3V or another value according to specific requirements.

Step S84: continuing to determine the current SOC of the battery, and estimate the current voltage of the battery according to the current SOC of the battery, the current temperature of the battery, and the updated ratio coefficient table until the current voltage of the battery is less than or equal to the voltage when the battery gets fully discharged if the current voltage of the battery is greater than the voltage when the battery gets fully discharged.

In the embodiment, continuing to determine the current SOC of the battery, and estimate the current voltage of the battery according to the current SOC of the battery, the current temperature of the battery, and the updated ratio coefficient table until the current voltage of the battery is less than or equal to the voltage when the battery gets fully discharged if the current voltage of the battery is greater than the voltage when the battery gets fully discharged, can be for example:

The current voltage V1 of the battery is 3.8V, the current voltage V1 of the battery is greater than 3V, determining the current SOC of the battery, and finding the current voltage V2 of the battery according to the current SOC of the battery, the current temperature of the battery, and the updated ratio coefficient table is 3.3V. At this moment, the current voltage V2 of the battery is greater than 3V, determining the current SOC of the battery, and finding the current voltage V3 of the battery according to the current SOC of the battery, the current temperature of the battery, and the updated ratio coefficient table is 3V. At this moment, the current voltage V3 of the battery is less than or equal to 3V.

Step S85: determining the variation value of the SOC of the battery when the battery gets fully discharged if the current voltage of the battery is less than or equal to the voltage when the battery gets fully discharged.

In the embodiment, determining the variation value of the SOC of the battery when the battery gets fully discharged includes: determining that a difference value between the current SOC of the battery during calculation of the current voltage of the battery and the SOC of the battery at the beginning of the discharge simulation is the variation value of the SOC of the battery when the battery gets fully discharged.

For example, in FIG. 7, a curve represented by the dot and dash line during simulation is the determined OCV, and a curve represented by the solid line is the determined current voltage. The SOC of the battery at the beginning of the simulation is Soc0, the present method simulates the discharge of the battery at ΔSoc1 the first time, finds the current OCV to be OCV1 at this moment, finds the current voltage difference of the battery to be ΔV1, and finds that the current voltage of the battery is U1. At this moment the current voltage of the battery is greater than the voltage when the battery gets fully discharged. Continuously simulating, the present method simulates the discharge of the battery at ΔSoc2 at the second time, finds the current OCV to be OCV2 at this moment, finds the current voltage difference of the battery to be ΔV2, and finds that the current voltage of the battery is U2. At this moment the current voltage of the battery is still greater than the voltage when the battery gets fully discharged. Continuously simulating, the present method simulates the discharge of the battery at ΔSoc3 at the third time, finds the current OCV to be OCV3 at this moment, finds the current voltage difference of the battery to be ΔV3, and finds that the current voltage of the battery is U3. At this moment the current voltage of the battery is still greater than the voltage when the battery gets fully discharged. Continuously simulating, the present method simulates the discharge of the battery at ΔSoc4 at the fourth time, finds the current OCV to be OCV4 at this moment, finds the current voltage difference of the battery to be ΔV4, and finds that the current voltage of the battery is U4. At this moment the current voltage of the battery is less than the voltage when the battery gets fully discharged, the present method stops the simulation and determines that the variation value of the SOC of the battery when the battery is discharged to the voltage when the battery gets fully discharged is ΔSoc.

Step S66, finding a residual capacity of the battery according to the variation value of the SOC of the battery.

In the embodiment, finding a residual capacity of the battery according to the variation value of the SOC of the battery includes: finding the residual capacity of the battery according to an equation $Q_{res}=\Delta SOC \times Q_{abs}$, where $Q_{res}$ is the residual, capacity of the battery, ΔSOC is the variation value of the SOC of the battery, and $Q_{abs}$ is the actual capacity-2 of the battery.

In the embodiment, after finding a residual capacity of the battery according to the variation value of the SOC of the battery, the method for estimating state of charge further includes:

L1: finding a full charge capacity of the battery.

In the embodiment, finding a full charge capacity of the battery includes: finding the full charge capacity of the battery via an equation $FCC=Q_{star}+Q_{past}+Q_{res}$, where FCC is the full charge capacity of the battery, $Q_{star}$ is a discharge capacity at the SOC after the full charge of the battery and before the first charge and discharge cycle, $Q_{past}$ is a discharge capacity after the SOC and before the beginning of the simulation, and $Q_{res}$ the residual capacity of battery. As shown in FIG. 7, is the $Q_{star}$ is a discharge capacity at the idle state, $Q_{past}$ is a discharge capacity at the discharging state, and $Q_{res}$ is the residual capacity of the battery established by the simulation of the battery.

In the embodiment, the method further includes: determining the discharge capacity at the SOC after the full charge of the battery and before the first charge and discharge cycle according to the initialized SOC and the actual capacity-2 of the battery. In detail, the method further includes: determining the discharge capacity at the SOC after the full charge of the battery and before the first charge and discharge cycle via an equation $Q_{star}=(100\%-SOC)\times Q_{abs}$ according to the initialized SOC and the actual capacity-2 of the battery, where, $Q_{star}$ is the discharge capacity at the SOC after the full charge of the battery and before the first charge and discharge cycle, SOC is the SOC of the battery after the full charge of the battery and before the first charge and discharge cycle, and $Q_{abs}$ is the actual capacity-2 of the battery. In the embodiment, before determining the discharge capacity at the SOC after the full charge of the battery and before the first charge and discharge cycle according to the initialized SOC and the actual capacity-2 of the battery, the method further includes: determining the SOC of the battery after the full charge of the battery and before the first charge and discharge cycle via Ohm's law.

In the embodiment, the method further includes: determining the discharge capacity after the SOC and before the beginning of the simulation according to the actual discharge current and the actual discharge time. In detail, the method further includes: taking the discharge capacity after the SOC and before the beginning of the simulation as the product of the actual discharge current and the actual discharge time. In the embodiment, before determining the discharge capacity after the SOC and before the beginning of the simulation according to the actual discharge current and the actual discharge time, the method further includes: collecting the actual discharge current of the battery at time interval; and determining the discharge capacity after the SOC and before the beginning of the simulation via an equation $Q_{past}=\Sigma_{i=1}^{n} \times \Delta t_i$. Where, $Q_{past}$ is the discharge capacity after the SOC and before the beginning of the simulation, n is a number of times collecting the actual discharge current of the battery, $I_i$ is an ith collected actual discharge current of the battery, and $\Delta t_i$ is an ith time interval.

L2: Finding the residual SOC of the battery according to the residual capacity of the battery and the full charge capacity of the battery.

In the embodiment, finding the residual SOC of the battery according to the residual capacity of the battery and the full charge capacity of the battery includes: finding the residual SOC of the battery according to an equation $$RSOC = \frac{Q_{res}}{FCC},$$

where RSOC is the residual SOC of the battery, $Q_{res}$ is the residual capacity of the battery, and FCC is the full charge capacity of the battery.

Referring back to FIG. 1, in the embodiment, the storage unit 11 is an inner storage unit of the electronic device, namely a built-in storage unit of the electronic device. In other embodiments, the storage unit 11 can also be an external storage unit, namely a peripheral storage unit of the electronic device.

In the embodiment, the storage unit 11 is configured to store program code and various data, and complete high-speed and automatic accessing of program or data during the operation of the electronic device.

The storage unit 11 can include high-speed random access memory. The storage unit 11 can further include non-transitory storage medium, such as hard disk, memory, plug-in hard disk, smart media card, secure digital, flash card, at least one disk storage device, flash memory, or other transitory storage medium.

In at least one embodiment, the at least one processor 12 can be one or more central processing units, or it can be one or more other universal processors, digital signal processors, application specific integrated circuits, field-programmable gate arrays, or other programmable logic devices, discrete gate or transistor logic, discrete hardware components, and so on. The at least one processor can be a microprocessor or the at least one processor can be any regular processor, or the like.

If the integrated module/unit of the storage unit 11 is implemented in the form of or by means of a software functional unit and is an independent product sold or used, all parts of the integrated module/unit of the storage unit may be stored in a computer-readable storage medium. The present disclosure can use one or more programs to control the related hardware to implement all steps of the methods of this disclosure. The one or more programs can be stored in a computer-readable storage medium. The one or more programs can accomplish the block of the exemplary method when executed by the at least one processor. The one or more stored programs can include program code. The program code can be in the form of source code, object code, executable code file, or in some intermediate form. The computer-readable storage medium may include any entity or device capable of recording and carrying the program codes, recording media, USB flash disk, mobile hard disk, disk, computer-readable storage medium, read-only memory, and the like.

Division of the modules is only a logical function division, and other division manners may be adopted during practical implementation. Each function module in each embodiment of the present disclosure may be integrated into a processing module, each module may also exist independently and physically, and two or more than two modules may also be integrated into a module. The above-mentioned integrated module may be implemented in a form of hardware, and may also be implemented in forms of hardware and software function module.

The embodiments shown and described above are only examples. Therefore, many commonly-known features and details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims. It will, therefore, be appreciated that the embodiments described above may be modified within the scope of the claims.

What is claimed is:

1. A method for updating voltage difference of a battery, comprising:
    presetting a relationship of voltage difference of the battery vs. state of charge;
    detecting a state of charge-1 of the battery;
    determining a first voltage difference of the battery according to the state of charge-1 of the battery; and
    updating the relationship of voltage difference of the battery vs. state of charge according to the first voltage difference of the battery.

2. The method for updating voltage difference of the battery according to claim 1, wherein determining the first voltage difference of the battery according to the state of charge-1 of the battery comprises:
    determining the first voltage difference of the battery when the battery is discharged at a plurality of different rates according to the state of charge-1 of the battery.

3. The method for updating voltage difference of the battery according, to claim 1, wherein determining the first voltage difference of the battery according to the state of charge-1 of the battery comprises:
    determining the first voltage difference of the battery during a battery discharging period according to the state of charge-1 of the battery.

4. The method for updating voltage difference of the battery according to claim 3, wherein the method further comprises:
    detecting a state of charge-2 of the battery and an actual capacity-1 of the battery;
    determining a first state of charge according to the state of charge-2 of the battery and the actual capacity-1 of the battery;
    determining the state of charge-1 of the battery according to the first state of charge; determining a second state of charge according to the state of charge-2 of the battery;
    determining a state of charge-3 of the battery according to the first state of charge and the second state of charge;
    wherein the state of charge-2 of the battery is an initialized state of charge and the actual capacity-1 of the battery is a preset capacity when the first state of charge is determined for a first time.

5. The method for updating voltage difference of the battery according to claim 4, wherein the method further comprises:
    determining that a first open circuit voltage is a current battery voltage; and
    querying the relationship of voltage difference of the battery vs. state of charge to determine the initialized state of charge according to the first open circuit voltage.

6. The method for updating voltage difference of the battery according to claim 4, wherein determining the first state of charge according to the state of charge-2 of the battery and the actual capacity-1 of the battery comprises:
    determining the first state of charge according to the state of charge-2 of the battery, a current battery current, a difference between current time and a previous time of obtaining the battery current, and the actual capacity-1 of the battery via a coulomb counting method;
    where the coulomb counting method comprises:

$$SOC_1 = SOC_0 + I_{bat} \times \Delta t / Q_{abs};$$

wherein $SOC_1$ is the first state of charge, $SOC_0$ is the state of charge-2 of the battery, $I_{bat}$ is the current battery current, $\Delta t$ is a difference between the current time and the previous time of obtaining the battery current, and $Q_{abs}$ is the actual capacity-1 of the battery.

7. The method for updating voltage difference of the battery according to claim 3, wherein determining the first voltage difference of the battery during the battery discharging period according to the state of charge-1 of the battery comprises:
    querying the relationship of voltage difference of the battery vs. state of charge to determine a second open circuit voltage according to the state of charge-1 of the battery; and
    determining that the first voltage difference of the battery during the battery discharging period is a value of difference between the second open circuit voltage and a current battery voltage.

8. The method for updating voltage difference of the battery according to claim 1, wherein updating the relationship of voltage difference of the battery vs. state of charge according to the first voltage difference of the battery comprises:
    processing the first voltage difference of the battery via a monadic linear regression method to determine a second voltage difference of the battery; and
    updating the relationship of voltage difference of the battery vs, state of charge according, to the second voltage difference of the battery;
    wherein before updating the relationship of voltage difference of the battery vs. state of charge according to the second voltage difference of the battery, the method comprises:
    determining that an absolute value of a difference between the second voltage difference of the battery and a third voltage difference of the battery is less than an allowable maximum voltage difference.

9. The method for updating voltage difference of the battery according to claim 1, wherein presetting the relationship of voltage difference of the battery vs. state of charge comprises:
    presetting the relationship of voltage difference of the battery vs. state of charge at a plurality of different temperatures;
    the method further comprises:
    detecting a current battery temperature;
    updating the relationship of voltage difference of the battery vs. state of charge according to the first voltage difference of the battery comprises:
    updating the relationship of voltage difference of the battery vs. state of charge at each of the plurality of different temperatures according to the first voltage difference of the battery and the current battery temperature.

10. A method for estimating a state of charge, comprising:
    presetting a relationship of voltage difference of the battery vs. state of charge;

detecting a state of charge-1 of the battery;
determining a first voltage difference of the battery according to the state of charge-1 of the battery;
updating the relationship of voltage difference of the battery vs. state of charge according to the first voltage difference of the battery;
determining a variation of the state of charge of the battery when the battery gets fully discharged via simulation and according to the updated relationship of voltage difference of the battery vs. state of charge; and
estimating a residual capacity of the battery according to the variation of the state of charge of the battery.

11. The method for estimating the state of charge according to claim 10, wherein determining the first voltage difference of the battery according to the state of charge-1 of the battery comprises:
determining the first voltage difference of the battery when the battery is discharged at a plurality of different rates according to the state of charge-1 of the battery.

12. The method for estimating the state of charge according to claim 11, wherein determining the first voltage difference of the battery according to the state of charge-1 of the battery comprises:
determining the first voltage difference of the battery during a battery discharging period according to the state of charge-1 of the battery.

13. The method for estimating the state of charge according to claim 12, wherein the method further comprises:
detecting a state of charge-2 of the battery and an actual capacity-1 of the battery;
determining a first state of charge according to the state of charge-2 of the battery and the actual capacity-1 of the battery; and
determining the state of charge-1 of the battery according to the first state of charge;
determining a second state of charge according to the state of charge-2 of the battery;
determining a state of charge-3 of the battery according to the first state of charge and the second state of charge;
wherein the state of charge-2 of the battery is an initialized state of charge and the actual capacity-1 of the battery is a preset capacity when the first state of charge is determined for a first time.

14. The method for estimating the state of charge according to claim 13, wherein the method further comprises:
determining that a first open circuit voltage is a current battery voltage; and
querying the relationship of voltage difference of the battery vs. state of charge to determine the initialized state of charge according to the first open circuit voltage.

15. The method for estimating the state of charge according to claim 13, wherein determining the first state of charge according to the state of charge-2 of the battery and the actual capacity-1 of the battery comprises:
determining the first state of charge according to the state of charge-2 of the battery, a current battery current, a difference between current time and a previous time of obtaining the battery current, and the actual capacity-1 of the battery via a coulomb counting method;
where the coulomb counting method comprises:

$SOC_1 = SOC_0 + I_{bat} \times \Delta t / Q_{abs}$;

wherein $SOC_1$ is the first state of charge, $SOC_0$ is the state of charge-2 of the battery, $I_{bat}$ is the current battery current, $\Delta t$ is a difference between the current time and the previous time of obtaining the battery current, and $Q_{abs}$ is the actual capacity-1 of the battery.

16. The method for estimating the state of charge according to claim 12, wherein determining the first voltage difference of the battery during the battery discharging period according to the state of charge-1 of the battery comprises:
querying the relationship of voltage difference of the battery vs. state of charge to determine a second open circuit voltage according to the state of charge-1 of the battery; and
determining that the first voltage difference of the battery during the battery discharging period is a value of difference between the second open circuit voltage and a current battery voltage.

17. The method for estimating the state of charge according to claim 10, wherein updating the relationship of voltage difference of the battery vs. state of charge according to the first voltage difference of the battery comprises:
processing the first voltage difference of the battery via a monadic linear regression method to determine a second voltage difference of the battery; and
updating the relationship of voltage difference of the battery vs. state of charge according to the second voltage difference of the battery;
wherein before updating the relationship of voltage difference of the battery vs. state of charge according to the second voltage difference of the battery, the method comprises:
determining that an absolute value of a difference between the second voltage difference of the battery and the third voltage difference of the battery is less than an allowable maximum voltage difference.

18. The method for estimating the state of charge according to claim 10, wherein presetting the relationship of voltage difference of the battery vs. state of charge comprises:
presetting the relationship of voltage difference of the battery vs. state of charge at each of a plurality of different temperatures;
the method further comprises:
detecting a current battery temperature;
updating the relationship of voltage difference of the battery vs. state of charge according to the first voltage difference of the battery comprises:
updating the relationship of voltage difference of the battery vs. state of charge at each of the plurality of different temperatures according to the first voltage difference of the battery and the current battery temperature.

19. The method for estimating the state of charge according to claim 18, wherein determining the variation of the state of charge of the battery when the battery gets fully discharged via simulation and according to the updated relationship of voltage difference of the battery vs. state of charge comprises:
updating a ratio coefficient table at a preset discharge rate between the first voltage difference of the battery corresponding to each of the plurality of different state of charges of the battery at each of the plurality of different temperatures and the first voltage difference of the battery corresponding to each of the plurality of different state of charges of the battery at preset temperature according to the updated relationship of voltage difference of the battery vs. state of charge; and determining the variation of the state of charge of the battery when the battery gets fully discharged via simulation and according to the updated ratio coefficient table.

20. The method for estimating the state of charge according to claim 19, wherein determining the variation of the state of charge of the battery when the battery gets frilly discharged via simulation and according to the updated ratio coefficient table comprises:
   determining a current state of charge of the battery;
   estimating a current voltage of the battery according to the current state of charge of the battery, a current temperature of the battery, and the updated ratio coefficient table;
   determining whether the current voltage of the battery is less than or equal to a voltage when the battery gets fully discharged;
   continuing to determine the current state of charge of the battery, and estimate the current voltage of the battery according to the current state of charge of the battery, the current temperature of the battery, and the updated ratio coefficient table until the current voltage of the battery is less than or equal to the voltage when the battery gets fully discharged if the current voltage of the battery is greater than the voltage when the battery gets fully discharged; and
   determining the variation of the state of charge of the battery when the battery gets fully discharged if the current voltage of the battery is less than or equal to the voltage when the battery gets fully discharged.

21. The method for estimating the state of charge according to claim 20, wherein determining the current state of charge of the battery comprises:
   detecting a previous state of charge of the battery; and
   estimating the current state of charge of the battery according to the previous state of charge of the battery.

22. The method for estimating the state of charge according, to claim 21, wherein when the current voltage of the battery is estimated for a first time:
   detecting the previous state of charge of the battery comprises:
   detecting the state of charge of the battery at a beginning of the simulation; and
   estimating the current state of charge of the battery according to the previous state of charge of the battery comprises:
   estimating the current state of charge of the battery according to the state of charge of the battery at the beginning of the simulation.

23. The method for estimating the state of charge according to claim 20, wherein estimating the current voltage of the battery according to the current state of charge of the battery, the current temperature of the battery, and the updated ratio coefficient table comprises:
   estimating a current open circuit voltage according to the current state of charge of the battery;
   estimating a current voltage difference of the battery according to the current state of charge of the battery, the current temperature of the battery, and the updated ratio coefficient table; and
   estimating the current voltage of the battery according to the current open circuit voltage and the current voltage difference of the battery.

24. The method for estimating the state of charge according to claim 23, wherein estimating the current voltage difference of the battery according to the current state of charge of the battery, the current temperature of the battery, and the updated ratio coefficient table comprises:
   estimating a voltage difference coefficient at a discharge current of the battery according to the updated ratio coefficient table; and
   estimating the current voltage difference of the battery according to the current state of charge of the battery, the current temperature of the battery, and the voltage difference coefficient.

25. The method for estimating the state of charge according to claim 24, wherein estimating the voltage difference coefficient at the discharge current of the battery according to the updated ratio coefficient table comprises:
   estimating the voltage difference coefficient at the discharge current of the battery according to an equation $$k = K(SOC, T) \times \frac{I}{MC},$$

wherein k is the voltage difference coefficient at the discharge current of the battery, K(SOC, T) is the updated ratio coefficient table, I is the discharge current of the battery, and MC is a preset discharge rate.

26. The method for estimating the state of charge according to claim 24, wherein estimating the current voltage difference of the battery according to the current state of charge of the battery, the current temperature of the battery, and the voltage difference coefficient comprises:
   estimating the current voltage difference of the battery according to an equation $$\Delta V(SOC,T,I) = \Delta V(SOC,N° C.) \times k,$$

wherein $\Delta V(SOC,T,I)$ is the current voltage difference of the battery, $\Delta V(SOC,N° C.)$ is the relationship of voltage difference of the battery vs. state of charge at a preset temperature and at a preset discharge rate, N° C. is the preset temperature, and k is the voltage difference coefficient at the discharge current of the battery.

27. The method for estimating the state of charge according to claim 20, wherein before estimating the current voltage difference of the battery according to the current state of charge of the battery, the current temperature of the battery, and the updated ratio coefficient table, the method further comprises:
   estimating the current temperature of the battery.

28. The method for estimating the state of charge according to claim 27, wherein estimating the current temperature of the battery comprises:
   detecting a previous temperature of the battery;
   estimating a current variation value of the temperature of the battery; and estimating the current temperature of the battery according to the previous temperature of the battery and the current variation value of the temperature of the battery.

29. The method for estimating the state of charge according to claim 28, wherein estimating the current variation value of the temperature of the battery comprises:
   estimating the current variation value of the temperature of the battery according to an equation $$c \times m \times \frac{dT}{dt} = I^2 \times R + I \times T \times \frac{\partial E}{\partial T} - h \times S \times (T - Tenv),$$

wherein c is a specific heat capacity of the battery, m is a quality of the battery, $\frac{dT}{dt}$ is a variation value of the temperature of the battery, I is a discharge current of the battery, R is a current impedance of the battery, T is the previous temperature of the battery, $\frac{\partial E}{\partial T}$ is an entropy coefficient of the battery, h is a heat transfer coefficient of the battery, S is a surface area of the battery, and Tenv is an environment temperature;
before estimating the current variation value of the temperature of the battery according to the equation $$c \times m \times \frac{dT}{dt} = I^2 \times R + I \times T \times \frac{\partial E}{\partial T} - h \times S \times (T - Tenv),$$

the method further comprises:
querying an updated relationship of voltage difference of the battery vs. state of charge to estimate a terminal voltage of the battery according to the current state of charge of the battery; and
estimating the current impedance of the battery according to an equation $$R = \frac{V}{I},$$

wherein R is the current impedance of the battery, V is the terminal voltage of the battery, and I is a discharge current of the battery.

30. The method for estimating the state of charge according to claim 10, wherein estimating a residual capacity of the battery according to the variation of the state of charge of the battery comprises:
estimating the residual capacity of the battery according to an equation $Q_{res} + \Delta SOC \times Q_{abs}$, wherein $Q_{res}$ is the residual capacity of the battery, $\Delta SOC$ is the variation of the state of charge of the battery, and $Q_{abs}$ is an actual capacity-2 of the battery.

31. The method for estimating the state of charge according to claim 30, wherein after estimating the residual capacity of the battery according to the variation of the state of charge of the battery, the method further comprises:
estimating a full charge capacity of the battery; and
estimating a residual state of charge of the battery according to the residual capacity of the battery and the full charge capacity of the battery.

32. The method for estimating state of charge as described in claim 31, wherein estimating a full charge capacity of the battery comprises:
estimating the full charge capacity of the battery via an equation $FCC = Q_{star} + Q_{past} + Q_{res}$, wherein FCC is the full charge capacity of the battery, $Q_{star}$ is a discharge capacity at the state of charge after the full charge of the battery and before the first charge and discharge cycle, $Q_{past}$ is a discharge capacity after the state of charge and before the beginning of the simulation, and $Q_{res}$ is the residual capacity of the battery.

33. The method for estimating state of charge as described in claim 31, wherein estimating the residual state of charge of the battery according to the residual capacity of the battery and the full charge capacity of the battery comprises:
estimating the residual state of charge of the battery according to an equation $$RSOC = \frac{Q_{res}}{FCC},$$

wherein RSOC is the residual state of charge of the battery, $Q_{res}$ is the residual capacity of the battery, and FCC is the full charge capacity of the battery.

34. An electronic device comprising:
a battery;
at least one processor; and
a storage system storing one or more programs which when executed by the at least one processor, causes the at least one processor to:
preset a relationship of voltage difference of the battery vs. state of charge;
detect a state of charge-1 of the battery;
determine a first voltage difference of the battery according to the state of charge-1 of the battery;
update the relationship of voltage difference of the battery vs. state of charge according to the first voltage difference of the battery;
determine a variation of the state of charge of the battery when the battery gets fully discharged via simulation and according to the updated relationship of voltage difference of the battery vs. state of charge; and
estimate a residual capacity of the battery according to the variation of the state of charge of the battery.

35. A non-transitory storage medium having stored thereon instructions that, when executed by a processor of an electronic device, causes the processor to perform a method for estimating state of charge, the electronic device comprising a battery, the method comprising:
presetting a relationship of voltage difference of the battery vs. state of charge;
detecting a state of charge-1 of the battery;
determining a first voltage difference of the battery according to the state of charge-1 of the battery; and
updating the relationship of voltage difference of the battery vs. state of charge according to the first voltage difference of the battery;
determining a variation of the state of charge of the battery when the battery gets fully discharged via simulation and according to the updated relationship of voltage difference of the battery vs. state of charge; and
estimating a residual capacity of the battery according to the variation of the state of charge of the battery.

* * * * *